US006606340B2

(12) United States Patent
Zhang et al.

(10) Patent No.: US 6,606,340 B2
(45) Date of Patent: Aug. 12, 2003

(54) CONTINUOUSLY GRATING-TUNED EXTERNAL CAVITY LASER WITH AUTOMATIC SUPPRESSION OF SOURCE SPONTANEOUS EMISSION AND AMPLIFIED SPONTANEOUS EMISSION

(75) Inventors: Guangzhi Z. Zhang, San Jose, CA (US); I-Fan Wu, Fremont, CA (US)

(73) Assignee: New Focus, Inc., San Jose, CA (US)

( * ) Notice: Subject to any disclaimer, the term of this patent is extended or adjusted under 35 U.S.C. 154(b) by 154 days.

(21) Appl. No.: 09/816,747

(22) Filed: Mar. 23, 2001

(65) Prior Publication Data

US 2001/0043637 A1 Nov. 22, 2001

Related U.S. Application Data

(60) Provisional application No. 60/191,699, filed on Mar. 23, 2000, and provisional application No. 60/191,694, filed on Mar. 23, 2000.

(51) Int. Cl.$^7$ .............................................. H01S 3/08
(52) U.S. Cl. ............................................. 372/107
(58) Field of Search .............................. 372/107, 98

(56) References Cited

U.S. PATENT DOCUMENTS

| 4,881,801 | A | * | 11/1989 | Gebelein | 350/503 |
|---|---|---|---|---|---|
| 5,319,668 | A | * | 6/1994 | Luecke | 372/107 |
| 5,379,310 | A | * | 1/1995 | Papen et al. | 372/23 |
| 5,594,744 | A | | 1/1997 | Lefevre et al. | 372/20 |
| 5,771,252 | A | | 6/1998 | Lang et al. | 372/20 |
| 5,781,571 | A | * | 7/1998 | Nabors et al. | 372/21 |
| 5,867,512 | A | | 2/1999 | Sacher | 372/20 |
| 5,903,358 | A | * | 5/1999 | Zare et al. | 356/437 |

OTHER PUBLICATIONS

Agilent Technologies, "Agilent 8164A Lightwave Measurement System Technical Specifications," 1999.
Day et al., "Widely Tunable External Cavity Diode Lasers," New Focus, Inc.

(List continued on next page.)

Primary Examiner—Paul Ip
Assistant Examiner—Leith A Al-Nazer
(74) Attorney, Agent, or Firm—Lumen Intellectual Property Services, Inc.

(57) ABSTRACT

Disclosed is an external cavity diode laser system that includes a dispersion unit; a gain element producing coherent light incident upon the dispersion unit; and the dispersion unit dispersing the incident coherent light into dispersed light, the dispersed light comprising a reflected diffraction beam and at least one of angularly-separated source spontaneous emission or angularly-separated amplified spontaneous emission; a guiding dispersion unit that guides the dispersed light diffracted upon it from the dispersion unit while maintaining an angular separation between the reflected diffraction beam and at least one of angularly-separated source spontaneous emission or angularly-separated amplified spontaneous emission; and a physical filtering device that physically filters the reflected diffraction beam from the spatially separated at least one of angularly-separated source spontaneous emission or angularly-separated amplified spontaneous emission guided to the physical filtering device by the guiding unit to produce a low-noise laser beam. Also disclosed are methods relating to producing low-noise laser beams.

27 Claims, 23 Drawing Sheets

OTHER PUBLICATIONS

Leckel et al., "Impact of source spontaneous emission (SSE) on the measurement of DWDM components," Optical Fiber Communication Conference, Mar. 8, 2000, TOPS vol. 37, Edited by Li, T.

Littman, Michael G., "Single–mode operation of grazing–incidence pulsed dye laser ," Research Laboratory of Electronics and Department of Physics. Massachusetts Institute of Technology, Cambridge, MA 02139, May 12, 1978, Optical Society of America, 1978.

Littman et al., "Spectrally narrow pulsed dye laser without beam expander, " Optical Society of America, 1978.

Liu et al., "Novel gEometry for single–mode scanning of tunable lasers, " Department of Mechanical and Aerospace Engineering, Princeton University, Princeton, NJ 08544, Nov. 24, 1980, Optical Society of America, 1981.

McNicholl et al. "Synchronous cavity mode and feedback wavelength scanning in dye laser oscillators with gratings, " State University of NY Physics Dept., Stonybrook, NY 11794, May 2, 1985, Optical Society of America, 1985.

Shoishan et al., "Narrowband operation of a pulsed dye laser without intracavity beam expansion, " Department of Physics, Technion–Israel Institute of Technology, Haifa, Israel, Dec. 6, 1976, Journal of Applied Physics, vol. 48, No. 11, Nov. 1977.

Wieman, Carl E., "Using diode lasers for atomic physics, " Rev. Sci. Instrum. 62(1), Jan., 1991.

Zhang et al., "Lasing threshold reduction in grating–tuned cavities, " Optical Society of America, 1997.

Zhang et al., Scanning geometry for broadly tunable single–mode pulsed dye lasers,: Optical Society of America, 1992.

* cited by examiner

CONTINUOUSLY GRATING-TUNED EXTERNAL CAVITY LASER WITH AUTOMATIC SUPPRESSION OF SOURCE SPONTANEOUS EMISSION AND AMPLIFIED SPONTANEOUS EMISSION

This application claims the benefit of provisional applications Ser. No. 60/191,699 filed Mar. 23, 2000 and No. 60/191,694 filed Mar. 23, 2000.

BACKGROUND OF THE INVENTION

1. Field of the Invention

The present invention relates to grating-tuned external cavity lasers and more particularly to a method and apparatus for generating a continuously-tunable, low-noise laser beam in a grating-tuned external cavity laser.

2. Description of Related Art

Grating-tuned external cavity lasers produce continuously-tunable laser beams consisting of light with high coherence and very narrow linewidth. To obtain high coherence and narrow linewidth, a grating is generally employed to disperse the emission from a light source or gain element, and feed it back to the gain medium at a wavelength selected by a tuning device. Tunable laser beams can be produced either by rotating a grating in a Littrow-type arrangement, or a reflector in a Littman-type configuration. Littman-type tunable laser systems are described in the publications, "Spectrally Narrow Pulse Dye Laser Without Beam Expander," by Michael G. Littman and Harold J. Metcalf, *Applied Optics*, Vol. 17, No. 14, pages 2224–2227, Jul. 15, 1978, and "Narrowband Operation Of A Pulsed Dye Laser Without Intracavity Beam Expansion" by l. Shoshan, N. N. Dannon, and U. P. Oppenheim, *Journal of Applied Physics*, Vol. 48, pages 4495–4497, 1977. A single-longitudinal-mode (very narrow linewidth) frequency tunable pulsed dye laser was described in the publication, "Single-Mode Pulsed Tunable Dye Laser," by M. G. Littman, Optics Letters, Vol. 23, pages 138–140, 1978. This single-longitudinal mode laser provides a foundation for producing tunable narrow-bandwidth lasers.

FIG. 1 shows a prior art grating-tuned external cavity laser capable of producing a laser beam which is tunable over a broad range of wavelengths by rotation of a tuning reflector. Laser system 100 comprises pivot 102, base 104, plane reflector 106, gain medium 108, diffraction grating 110, tuning reflector 112, rotatable unit 114, output laser beam 116 and first-order diffracted radiation 118.

In the prior art system of FIG. 1, a proximal end of rotatable unit 114 is pivotably connected to base 104 by pivot 102. Tuning reflector 112 is mounted on rotatable unit 114 forming an acute angle with respect to diffraction grating 110, which is mounted on an upper surface of base 104. Plane reflector 106 and gain medium 108 are mounted on base 104 and are disposed to produce a laser beam which is incident on diffraction grating 110 at a grazing angle, thereby generating output laser beam 116 and first-order diffracted radiation 118.

In operation, rotating arm 114 pivots around pivot 102 such that tuning reflector 112 moves relative to diffraction grating 110. Plane reflector 106 and gain element 108 generate a laser beam which is incident on diffraction grating 110 at a grazing angle. Part of this laser beam is reflected as output laser beam 116 and exits laser system 100. The rest of the laser beam incident on diffraction grating 110 is diffracted and reflected to generate a light radiation pattern which includes first-order diffracted radiation 118. First-order diffracted radiation 118 retro-reflects off tuning reflector 112 and is again incident on diffraction grating 110.

Upon further diffraction and reflection by diffraction grating 110, a portion of first-order diffracted radiation 118 enters gain element 108 and plane reflector 106, thereby forming an external feedback laser cavity for laser system 100. The wavelength of output laser beam 116 depends on the angle formed by grating surface 110 and the reflective surface of tuning reflector 112, which may be adjusted by pivoting rotatable unit 114 around pivot 102. Consequently, the wavelength of output laser beam 116 may be tuned by pivoting rotatable unit 114 around pivot 102. Accurate positioning of pivot 102 enables mode-hop-free, continuous tuning of output laser beam 116 over the entire emission band of gain element 108.

A laser system similar to the prior art system shown in FIG. 1 is described in the publication, "Novel Geometry for Single-Mode Scanning of Tunable Lasers," by Michael G. Littman and Karen Liu, Optics Letters, Vol. 6, No.3, pages 117, 118, March, 1981. A mode-hop-free, Littman cavity laser system with broad-range tuning capabilities is set forth in the publication, "Synchronous Cavity Mode and Feedback Wavelength Scanning in Dye Laser Oscillators with Gratings," by Harold J. Metcalf and Patrick McNicholl, *Applied Optics*, Vol. 24, No. 17, pages 2757–2761, Sep. 1, 1985. The publication "Scanning Geometry for Broadly Tunable Single-Mode Pulsed Dye Lasers," by Guangzhi Z. Zhang and Kohzo Hakuta, *Optics Letters*, Vol. 17, No. 14, pages 997–999, Jul. 15, 1992, describes a dye laser system capable of continuously tuning a single-longitudinal-mode laser beam over a range of more than 190 cm$^{-1}$ by employing a predefined rotation pivot for the tuning reflector and grating.

Various configurations of grating-tuned, Littman-type, external laser cavity systems capable of providing continuous, broadband, mode-hop-free laser beams have been disclosed in U.S. Pat. No. 5,319,668 to Luecke, U.S. Pat. No. 5,867,512 to Sacher, U.S. Pat. No. 5,771,252 to Lang, U.S. Pat. No. 5,802,085 to Lefevre, et al and the publication "Continuously Tunable Diode Lasers," by Timothy Day, Frank Luecke, and Michel Brownell, *Lasers & Optronics*, No. 6, June, 1993, pp. 15–17. According to these publications, accurate positioning of the pivot is paramount to obtain continuous, broadband tuning capability over the entire emission bandwidth of the gain medium.

Lowering the lasing threshold for grating-tuned external cavity lasers increases the laser power output in the presence of optical power loss occurring inside the laser cavity due to grating diffraction. A method for reducing power loss was described in the publication, "Lasing Threshold Reduction for Grating-Tuned Laser Cavities," by Guangzhi Z. Zhang and Dennis Tokaryk, *Applied Optics*, vol. 36, No. 24, pages 5855–5858, Aug. 20, 1997. This publication introduced a laser system that utilized potentially wasted optical power in an effective feedback configuration.

Mode-hop-free, broadband tunable lasers have been extensively used in a wide range of applications, including laser spectroscopy, optical metrology, in-situ process monitoring and test and measurement of optical passive components in Dense Wavelength Division Multiplexing, Wavelength Division Multiplexing and optical fiber systems.

The output of grating-tuned, external cavity laser systems in the prior art generally consists of two spectral components: (1) a laser beam; and (2) background light radiation comprising Source Spontaneous Emission ("SSE") and Amplified Spontaneous Emission ("ASE") light radiation.

The laser beam is the desired output component and consists of substantially coherent, narrow-linewidth laser light. The SSE and ASE radiation, however, constitutes an undesirable incoherent noise background which is emitted directly by the gain element.

The laser beam component of the laser output couples with the SSE and ASE background radiation component in space and time. Although the SSE and ASE background radiation is usually weak in power as compared to the laser output, it has a significant effect in many sensitive applications including test and evaluation of optical passive components and fibers and Dense Wavelength Division Multiplexing, Wavelength Division Multiplexing and optical fiber data-transmission systems. Consequently, there is a need to filter out SSE and ASE background radiation from the output of grating-tuned, external cavity laser systems to obtain a coherent, narrow-linewidth, noise-free output laser beam.

A few types of grating-tuned external cavity laser systems that could suppress SSE and ASE background noise have been described in the publications, "Using Diode Lasers for Atomic Physics", by Carl E. Wieman and Leo Hollberg, Review of Scientific Instruments, vol. 62, pages 1–19, January, 1991 and "Impact of Source Spontaneous Emission (SSE) on the Measurement of DWDM Components", by Edgar Leckel et al. These systems insert a beam coupler, usually consisting of an optical flat, into the grating-tuned external feedback cavity, along the laser beam path, between coupler partially reflects the laser beam out of the cavity.

FIG. 2 shows a schematic representation of a tunable laser source constructed by Hewlett-Packard Co. based on the concept described in the above-cited publications. Laser system 200 consists of diffraction grating 210, waveguiding device 232, laser diode 250, tuning reflector 260, beam splitter 292, reflection mirror 294 and optical lens 296.

Laser diode 250 is disposed to generate a laser beam which is incident at a grazing angle upon diffraction grating 210. Beam splitter 292 is located along an optical path between laser diode 250 and diffraction grating 210 such that it intercepts a feedback light radiation component diffracted by diffraction grating 210. Reflection mirror 294 is disposed to intercept a light radiation component diverted by beam splitter 292. Optical lens 296 is disposed along an optical path between reflection mirror 294 and waveguiding device 232.

In operation, laser diode 250 generates a laser beam which is incident on diffraction grating 210 at a grazing angle. Part of this beam is reflected by diffraction grating 210 to provide a conventional laser output (not shown in FIG. 2). Diffraction grating 210 also diffracts a feedback light radiation component, which propagates back into laser diode 250 from the retroreflection of tuning reflector 260. Beam splitter 292 intercepts and partially reflects the feedback light radiation component, thereby giving rise to a diverted light radiation component. The diverted light radiation component consists of a laser beam, an angularly-separated SSE light component and an angularly-separated ASE light component. The diverted light radiation component reflects off reflection mirror 294 and is incident on optical lens 296. Optical lens 296 refracts the incident diverted light radiation while maintaining the angular separation between its three constituent components. Upon refraction by optical lens 296, the laser beam component of the diverted light radiation is coupled into waveguiding device 232 while the angularly-separated SSE and ASE components are filtered out, thereby giving rise to a low-noise laser beam (not shown in FIG. 2).

The laser system described above and shown in the embodiment of FIG. 2 has a number of disadvantages. A disadvantages of the laser system of FIG. 2 is that both the conventional output laser beam and the low-noise laser beam coupled into waveguiding device 232 have reduced optical power due to optical power losses and additional optical dispersion which occur in the laser cavity due to the introduction of beam splitter 292. A further disadvantage of this laser system is that the introduction of beam splitter 292 in the laser cavity modifies the cavity length, and consequently, component positions have to be carefully adjusted to achieve mode-free tuning for the output laser beams. Another disadvantage of the laser system shown in FIG. 2 is that introduction of beam splitter 292 into the laser cavity increases the lasing theshold of the laser cavity, therefore increasing the instability of the laser operation of laser diode 250.

Considering the limitations associated with grating-tuned, external cavity laser systems in the prior art, including the disadvantages described above, there is a need for a grating-tuned, external cavity laser system which can produce a continuously-tunable laser output with suppressed SSE and ASE background noise over the entire laser tuning range and with automatic wavelength and power tracking capability.

SUMMARY OF THE INVENTION

In an aspect, the invention relates to an external cavity diode laser system comprising a dispersion unit; a gain element producing coherent light incident upon the dispersion unit, and the dispersion unit dispersing the incident coherent light into dispersed light, the dispersed light comprising a reflected diffraction beam and at least one of angularly-separated source spontaneous emission or angularly-separated amplified spontaneous emission; a guiding dispersion unit that guides the dispersed light diffracted upon it from the dispersion unit while maintaining an angular separation between the reflected diffraction beam and at least on of angularly-separated source spontaneous emission or angularly-separated amplified spontaneous emission; and a physical filtering device that physically filters the reflected diffraction beam from the spatially separated at least one of angularly-separated source spontaneous emission or angularly-separated amplified spontaneous emission guided to the physical filtering device by the guiding unit to produce a low-noise laser beam.

In another aspect, the invention relates to a laser system comprising an external cavity diode laser that emits dispersed light, and the dispersed light comprising a reflected diffraction beam and at least one of angularly-separated source spontaneous emission or angularly-separated amplified spontaneous emission; a guiding dispersion unit, positioned along the beam path of the reflected diffraction beam; and a physical filtering device positioned along a beam path of the reflected diffracted beam that physically filters the reflected diffraction beam from the at least one of angularly-separated source spontaneous emission or angularly-separated amplified spontaneous emission to produce a low-noise laser beam.

In still another aspect, the invention relates to a method comprising providing an external cavity diode laser that emits a reflected diffraction beam and at least one of angularly-separated source spontaneous emission or angularly-separated amplified spontaneous emission; dispersing the reflected diffraction beam a first time along a propagation direction by disposing a dispersion unit in the optical path of the reflected diffraction optical beam; and physically filtering the reflected diffraction beam from the at least one of angularly-separated source spontaneous emission or angularly-separated amplified spontaneous emission.

In an aspect, the invention relates to an external cavity diode laser system comprising first dispersive means; means for producing coherent light incident upon the first dispersive means, the first dispersive means dispersing the incident coherent light into dispersed light, the dispersed light comprising a reflected diffraction beam and at least one of angularly-separated source spontaneous emission or angularly-separated amplified spontaneous emission; and physically-filtering means, disposed along a beam path of the reflected diffraction beam, for physically filtering the reflected diffraction beam from the at least one of angularly-separated source spontaneous emission or angularly-separated amplified spontaneous emission to produce a low-noise laser beam.

DETAILED DESCRIPTION OF THE INVENTION

According to the present invention, a grating-tuned, external cavity laser system and a method to suppress SSE and ASE background light noise is described. The system and method disclosed herein recycle and effectively employ optical power dissipated and wasted by prior art external cavity laser systems to produce a continuously-tunable, narrow-bandwidth laser beam with low SSE and ASE light noise in addition to the conventional laser beam associated with prior art external cavity laser systems.

Figure 1:
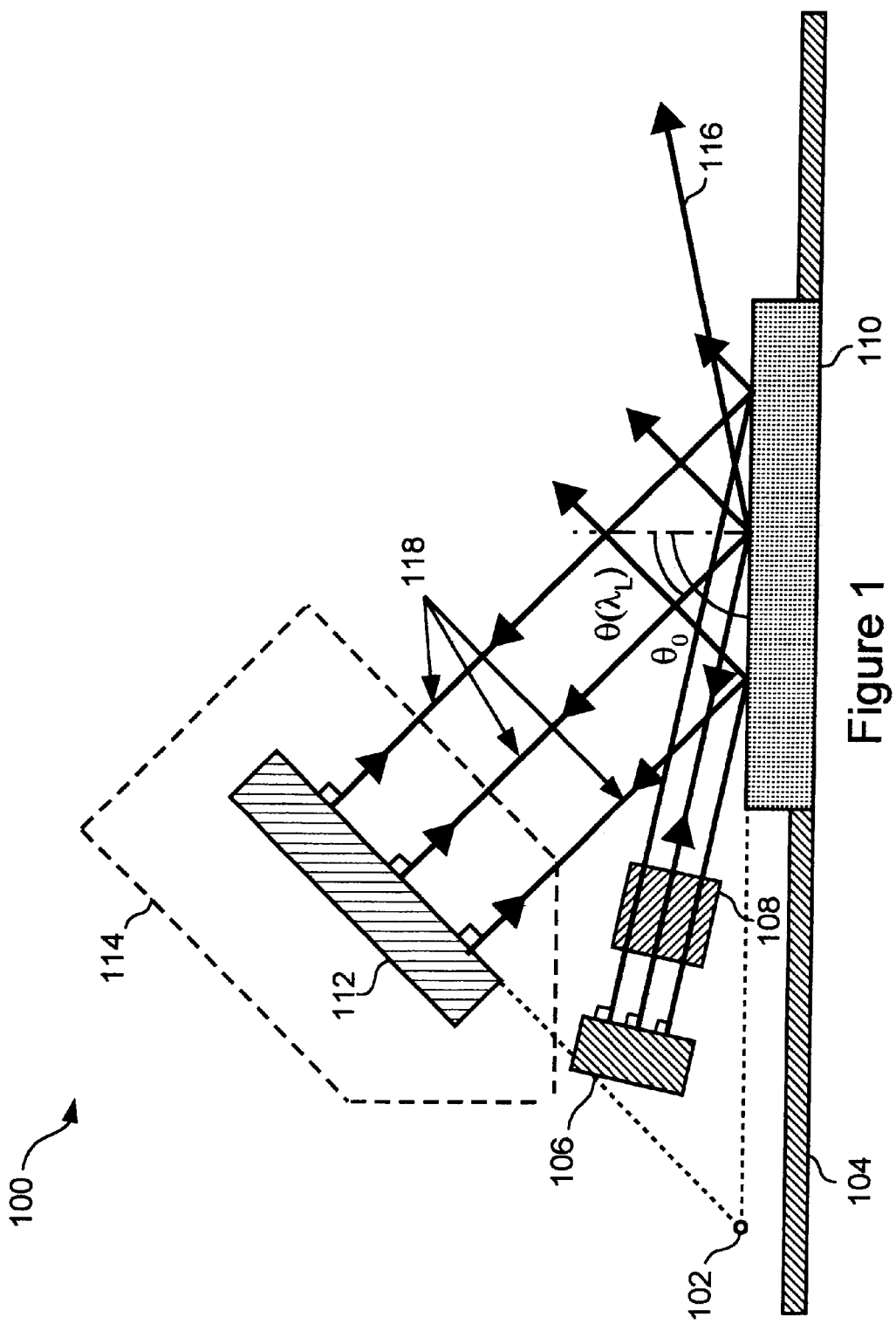
FIG. 1 shows a prior art grating-tuned, external cavity laser system.
Figure 2:
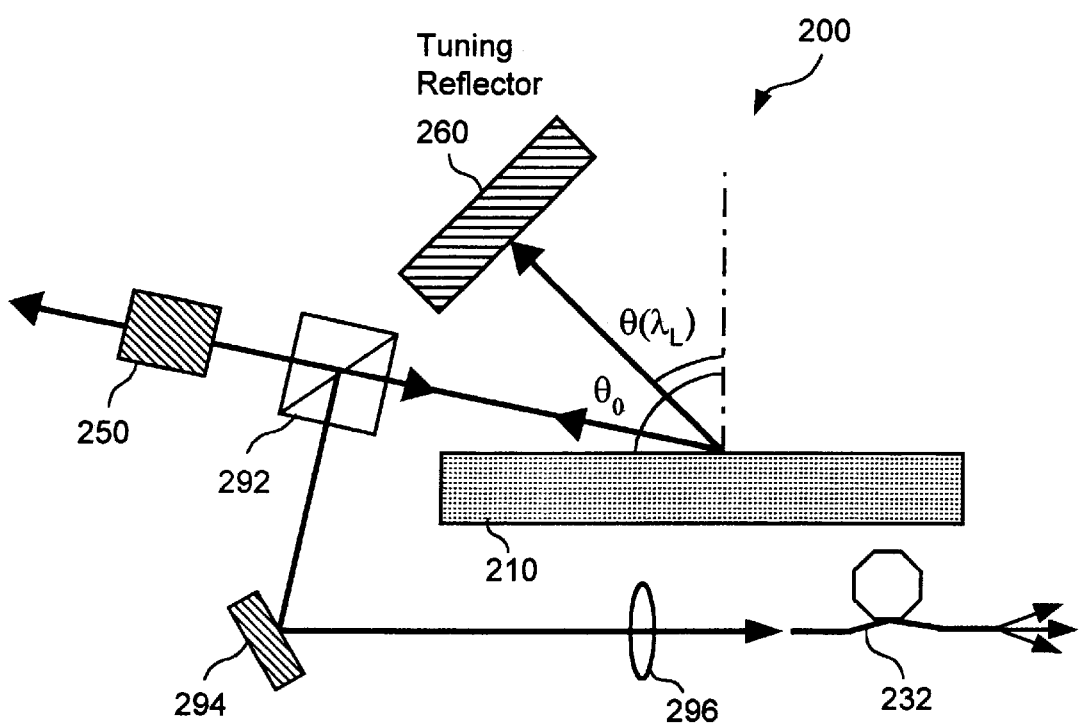
FIG. 2 shows another prior art grating-tuned, external cavity laser system including a beam splitter.

The present invention has numerous advantages over the laser systems in the prior art. For example, an advantage of the current invention over the laser system shown in FIG. 2 is that since the present invention does not insert any optical devices into the laser cavity, the present invention avoids perturbing the operation of the master laser cavity operation in general. As a result, the grating-tuned external cavity can directly and fully utilize its mode-hop-free tuning capacity to tune the laser wavelength over large bandwidths without any further adjustments and repositioning of optical components. In contrast, the presence of an optical beam splitter into the laser cavity of the laser system shown in FIG. 2 modifies the length of the laser cavity and requires repositioning of different components, as discussed above. Additional advantages of the present invention over the prior art, including over the system of FIG. 2, will be discussed below in conjunction with different embodiments of the present invention, or will be apparent to one skilled in the art.

Figure 3:
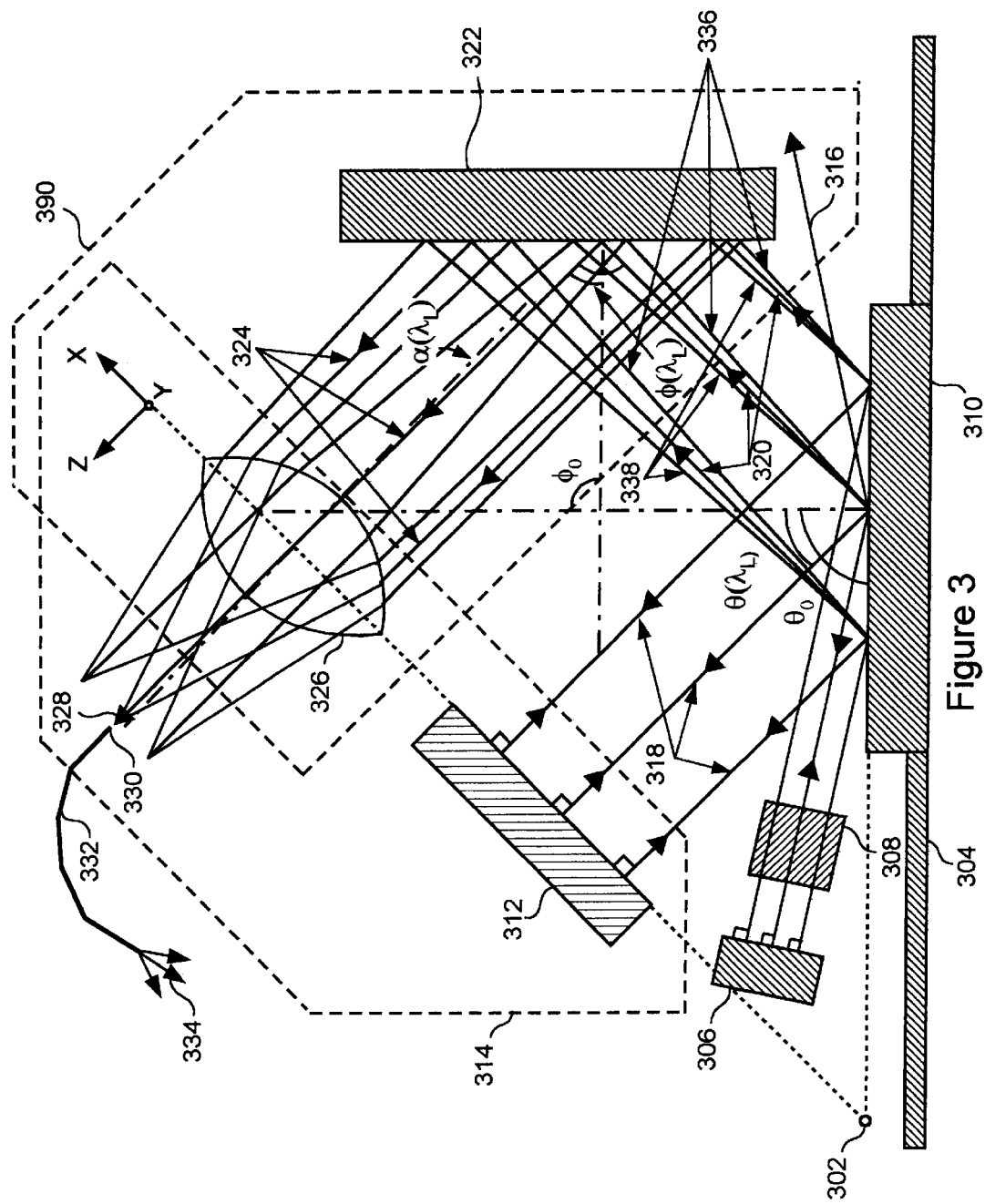
FIG. 3 shows a continuously-tunable, low-noise, grating-tuned, external cavity laser system according to the present invention with a guiding element comprising a flat reflection mirror and a beam collector comprising an optical lens.

FIG. 3 shows a tuning arrangement for SSE and ASE suppression in a grating-tuned external cavity laser with dual laser beam output. Dual-beam laser system 300 comprises pivot 302, base 304, plane reflector 306, gain medium 308, dispersion unit 310, tuning reflector 312, rotatable unit 314, output laser beam 316, first-order diffracted radiation 318, reflected diffraction beam 320, guiding mirror 322, collector incident light 324, beam collector 326, focused light spot 328, optical coupling device 330, waveguiding device 332, low noise laser beam 334, angularly-separated SSE 336, angularly-separated ASE 338, and coupling unit 390.

A proximal end of rotatable unit 314 is pivotably connected to base 304 by pivot 302. Tuning reflector 312 is mechanically coupled to rotatable unit 314 forming an acute angle with respect to dispersion unit 310, which is mechanically coupled to an upper surface of base 304. In a preferred embodiment, dispersion unit 310 comprises a diffraction grating and tuning reflector 312 comprises a Porro prism. Use of Porro prisms as reflectors is well-known in the art and is described in Eugene Hecht, *Optics*, Addison-Wesley Publishing Company, Inc. (1987), p. 168. In an alternative embodiment, tuning reflector 312 comprises a reflection mirror.

Beam collector 326 is mechanically coupled to rotatable unit 314 distally from tuning reflector 312 with respect to pivot 302. Guiding mirror 322 is mechanically coupled to base 304 and is located in line-of-sight of beam collector 326. Coupling unit 390 comprises guiding mirror 322, beam collector 326 and optical coupling device 330. Plane reflector 306 and gain medium 308 are mechanically coupled to base 304 and are disposed to produce a laser beam which is incident on dispersion unit 310 at a grazing angle, thereby generating output laser beam 316, first-order diffracted radiation 318, reflected diffraction beam 320, angularly separated SSE 336 and angularly-separated ASE 338. In a preferred embodiment, plane reflector 306 comprises a rear facet of a laser diode. Beam collector 326 is disposed along an optical path between guiding mirror 322 and optical coupling device 330 of waveguiding device 332. In a preferred embodiment, optical coupling device 330 comprises an optical fiber aperture or the tip of a fiberoptic cable, and waveguiding device 332 comprises a single-mode or a multi-mode fiberoptic cable.

In operation, rotating arm 314 pivots around pivot 302 such that tuning reflector 312 and beam collector 326 move relative to dispersion unit 310 and guiding mirror 322. Plane reflector 306 and gain element 308 generate coherent light radiation comprising a laser beam which is incident on dispersion unit 310 at a grazing angle. Part of this laser beam is reflected as output laser beam 316. Output laser beam 316 exits dual-beam laser system 300 and represents a conventional laser beam generally associated in the art with grating-tuned external cavity lasers. The rest of the laser beam incident on dispersion unit 310 is diffracted and reflected to generate a light radiation pattern which includes first-order diffracted radiation 318, reflected diffraction beam 320, angularly-separated SSE 336 and angulary-separated ASE 338. First-order diffracted radiation 318 retro-reflects off tuning reflector 312 and is again incident on dispersion unit 310. Upon further diffraction and reflection by dispersion unit 310, a portion of first-order diffracted radiation 318 enters gain element 308 and reflects off plane reflector 306 thereby forming an external feedback laser cavity for the dual-beam laser system 300.

Reflected diffraction beam 320 comprises a laser beam with a wavelength equal to the wavelength of output laser beam 316. Angularly-separated SSE 336 and angulary-separated ASE 338 comprise incoherent light radiation which spans a broad range of wavelengths and which propagates away from dispersion unit 310 on optical paths which form acute angles with the direction of propagation of reflected diffraction beam 320. Alternatively stated, angularly-separated SSE 336 and angulary-separated ASE 338 diverge from reflected diffraction beam 320 as they propagate away from dispersion unit 310.

Reflected diffraction beam 320, angularly-separated SSE 336 and angulary-separated ASE 338 propagate away from dispersion unit 310 on diverging optical paths and reflect off guiding mirror 322 to generate collector incident light 324. Beam collector 326 refracts collector incident light 324 and concentrates it into a number of discrete light spots including focused light spot 328. A spatial propagation separation of reflected diffraction beam 320 with respect to and angularly-separated SSE 336 and angulary-separated ASE 338 is maintained by coupling unit 390 upon reflection by guiding mirror 322 and refraction by beam collector 326, and is transposed into a spatial or angular separation of the discrete light spots formed by beam collector 326.

Each light spot comprises light with a narrow range of wavelengths. Focused light spot 328 comprises light from reflected diffraction beam 320, which has a narrow wavelength band centered on the wavelength of output laser beam 316. The total light energy contained in focused light spot 328 is significantly higher than the total light energy of any of the other light spots. Focused light spot 328 is coupled into optical coupling device 330 and propagates through waveguiding device 332, thereby generating low noise laser beam 334. The other focused light spots comprise light from angularly-separated SSE 336 and angularly-separated ASE 338. These focused light spots are physically filtered out by coupling unit 390 by not being coupled into waveguiding device 332, and therefore the SSE and ASE light noise is suppressed from low noise laser beam 334.

The propagation angles with respect to base 304 and the wavelengths of both output laser beam 316 and reflected diffraction beam 320 depend on the angle formed by dispersion unit 310 with the reflecting surface of tuning reflector 312, which may be adjusted by pivoting rotatable unit 314 around pivot 302. The propagation angles of reflected diffraction beam 320 with respect to base 304 and guiding mirror 322 determine the optical propagation pattern of collector incident light 324. As previously discussed, collector incident light 324 is refracted by beam collector 326 to generate focused light spot 328. Focused light spot 328 is located in the focal plane of beam collector 326 and its position depends on the optical characteristics of beam collector 326 and on the propagation pattern and wavelength structure of collector incident light 324. Since reflected diffraction beam 320 which is comprised in collector incident light 324 has substantially the same wavelength as output laser beam 316, and since the wavelength of output laser beam 316 may be tuned by pivoting rotatable unit 314 around pivot 302, the spatial distribution of focused light spot 328 can be adjusted by pivoting rotatable unit 314. The topography and elements of dual-beam laser system 300 are selected such that pivoting of rotatable unit 314 results both in controlled wavelength tuning of output laser beam 316 and in stable coupling of focused light spot 328 into optical coupling device 330.

The following discussion provides a mathematical description for the structure and operation of the embodiment shown in FIG. 3. Despite the specific nature of the following discussion, it may be applied generally in principle to other embodiments of the present invention. As discussed above, reflected diffraction beam 320 comprises a desired coherent light radiation component (i.e., a laser beam with a wavelength substantially identical with the wavelength of output laser beam 316). In contrast, angularly-separated SSE 336 and angularly-separated ASE 338 comprise undesired incoherent noise background light radiation which generally covers the full emission band of gain medium 308 and couple with reflected diffraction beam 320 in space and time. To suppress angularly-separated SSE 336 and angularly-separated ASE 338, spatial (i.e. angular) separation of these components and spatial narrow bandpass filtering are required. In the present invention, spatial (i.e. angular) separation is provided by the angular and spectral dispersion introduced by dispersion unit 310 and spatial narrow band-pass filtering is provided by coupling unit 390 through adequate placement of optical coupling device 330 relative to the location of focused beam spots 328.

Upon incidence on dispersion unit 310, the laser beam generated by gain medium 308 and plane reflector 306 is dispersed into a radiation pattern which includes output laser beam 316, first-order diffracted radiation 318 and reflected diffraction beam 320. Light comprising these three components propagates along different wavelength-dependent paths, forming angles $\theta(\lambda)$ with respect to dispersion unit 310. If the laser beam generated by gain medium 308 and plane reflector 306 forms an angle of incidence $\theta_0$ with respect to the dispersion unit 310 and if the spatial period of dispersion unit 310 is denoted by d, the angle $\theta(\lambda)$ can be expressed as, $$\theta(\lambda) = \arcsin\left[\frac{\lambda}{d} - \sin\theta_0\right].$$

Figure 4:
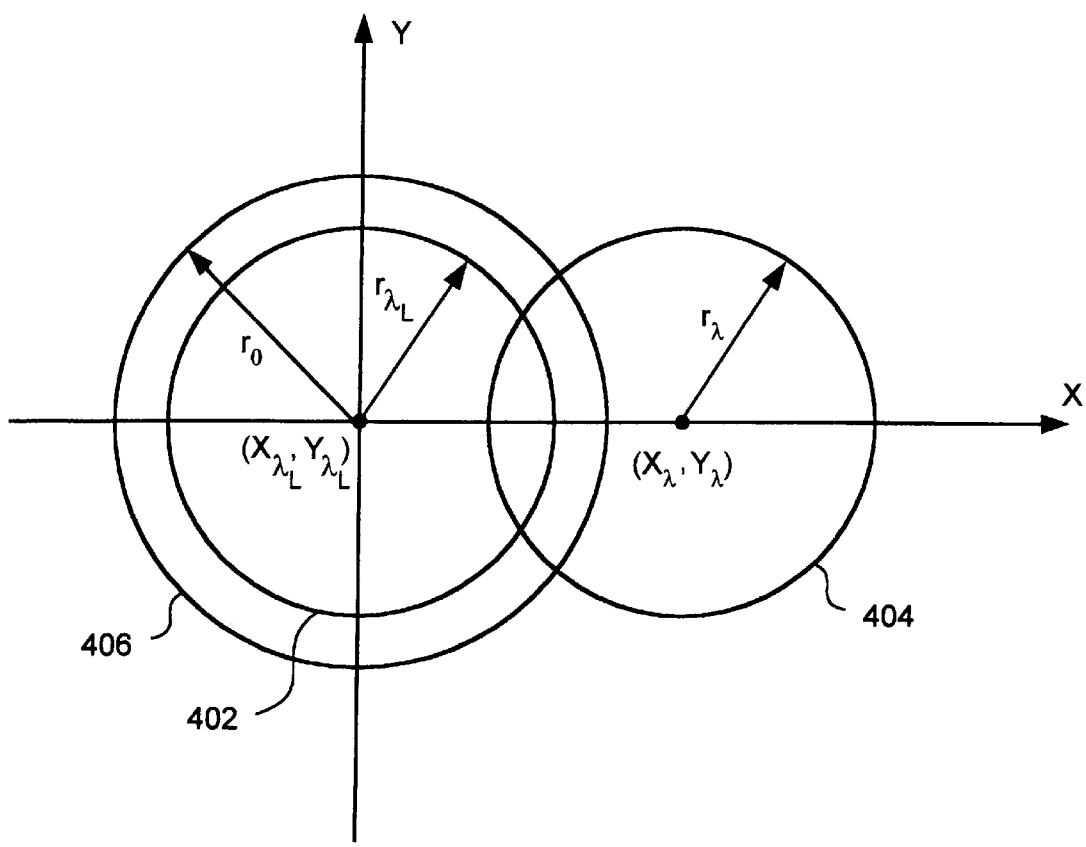
FIG. 4 shows a representation of the light radiation pattern in the X-Y focal plane of the beam collector shown in FIG. 3

The intensity of collector incident light 324 in the X-Y focal plane of beam collector 326 is described by a two-dimensional (x, y) equation which includes an angular-cone distribution-function representing the beam focusing effect of beam collector 326, $$I(\lambda,x,y,\Omega)=I(\lambda)\zeta(x-x_\lambda,y-y_\lambda,f,\Omega),$$

where a normalized arbitrary distribution function $\zeta(x-x_\lambda, y-y_\lambda,f,\Omega)$
provides a light intensity distribution for focused light spot 328 with beam center $(x_\lambda, y_\lambda, f)$ in the X-Y focal plane of beam collector 326 as illustrated in FIG. 4.

If the grating of diffraction grid 310 exhibits a one-dimensional variation, coordinates $x_\lambda$, and $y_\lambda$ can be expressed as $x_\lambda=f \tan \theta(\lambda)$ and $y_\lambda=0$, where f represents the focal length of the beam collector 326. In a preferred embodiment, beam collector 326 comprises a convex lens and f represents the focal length of the convex lens. In the X-Y focal plane of beam collector 326, optical coupling device 330 is aligned with the center of focused light spot 328 to receive the light with laser wavelength $\lambda_L$. In a preferred embodiment, optical coupling device 330 comprises a single-mode fiber, a multi-mode transparent fiber or a waveguide designed for coupling a light beam. Through proper alignment with focused light spot 328, optical coupling device 330 receives only light with wavelength $\lambda_L$ by filtering out light with other wavelengths than $\lambda_L$.

The light energy $E(\lambda)$ coupled into waveguiding device 332 by optical coupling device 330 is determined by convolution of the X-Y focal light intensity distribution function $I(\lambda,x,y,\Omega)$ with both an optical aperture function $\rho(x-x_{\lambda_L}, y-y_{\lambda_L},z-f,\Omega)$ characteristic to optical coupling device 330 and with a numerical aperture function $\kappa(\lambda)$ representing the average insertion or surface-reflection light coupling loss over the entire area of optical coupling device 330, $$E^{(fiber)}(\lambda)=I(\lambda)(1-\kappa(\lambda))\iiint \rho(x-x_{\lambda_L},y-y_{\lambda_L},f,\Omega)\cdot\zeta(x-x_\lambda,y-y_\lambda,f,\Omega)dxdyd\Omega=E(\lambda)(1-\kappa(\lambda))\sigma(\lambda)$$

where the filtering effect of the beam coupling device is represented by a filtering function $$\sigma(\lambda)=\iiint \rho(x-x_{\lambda_L},y-y_{\lambda_L},f,\Omega)\cdot\zeta(x-x_\lambda,y-y_\lambda,f,\Omega)dxdyd\Omega$$

If the numerical aperture of optical coupling device 330 is larger than the divergence of focused light spot 328 and if the area of optical coupling device 330 is larger than the size of focused light spot 328 at the laser wavelength $\lambda=\lambda_L$, all the light of the respective beam spot is coupled into waveguiding device 332. The energy of the light coupled into the fiber can therefore be expressed as, $$E^{(fiber)}(\lambda)\approx E(\lambda_L)(1-\kappa(\lambda_L)).$$

FIG. 4 shows a representation of the X-Y focal plane of beam collector 326 from FIG. 3 and illustrates how the present invention achieves spatial narrow band-pass filtering for light coupled into waveguiding device 332. FIG. 4 shows the focal plane 400 of beam collector 326. Focal plane 400 includes an aligned light spot 402, a misaligned light spot 404 and an optical aperture 406. Consistent with the previous discussion, beam collector 326 refracts collector incident light 324 and concentrates it into a number of discrete light spots in the focal plane 400 of beam collector 326. The spatial position of each light spot depends upon the wavelength of the light associated with that particular light spot.

Aligned light spot 402 represents focused light spot 328 from FIG. 3 which comprises light of substantially wavelength $\lambda_L$. Aligned light spot 402 is centered at coordinates $(x_{\lambda L}, y_{\lambda L})$ and has a radius of $r_{\lambda_L}$. The radius $r_{\lambda_L}$ is selected such that the resulting circular area includes only light with an intensity of at least 1/e of the peak value existing within aligned light spot 402. Aligned light spot 402 is concentrically collocated with optical aperture 406. If the radius $r_0$ of optical aperture 406 is larger than the radius $r_{\lambda_L}$ of aligned light spot 402, aligned light spot 402 is fully contained within optical aperture 406 and light from aligned light spot 402 may be fully coupled into waveguiding device 332. In contrast, misaligned light beam 404 (which includes SSE and ASE radiation) is centered at coordinates $(x_\lambda, y_\lambda)$ and is not fully contained within optical aperture 406. Consequently, light associated with misaligned light spot 404 cannot be fully coupled into waveguiding device 332 and is therefore at least partially filtered out.

As a result of spatial narrow band-pass filtering, therefore, for any light as well as SSE and ASE background noise radiation with wavelengths other than $\lambda_L$ ($\lambda\neq\lambda_L$), the energy coupled into waveguiding device 332 upon proper alignment of optical aperture 406 with aligned light spot 402 is minimized such that $E^{(fiber)}(\lambda)\approx 0$.

Referring to FIG. 4, for $r_\lambda \leq r_0$, the filtering function associated with optical aperture 406 can be expressed as $$\sigma(\lambda)=\pi^{-1}r_\lambda^{-1}\cdot\iiint \rho(x-x_{\lambda_L},y-y_{\lambda_L},f,\Omega)\cdot\zeta(x-x_\lambda,y-y_\lambda,f,\Omega)dxdyd\Omega.$$

For $r_\lambda \geq r_0$, however, the filtering function can be represented by $$\sigma(\lambda)=\pi^{-1}r_{\lambda_L}^{-2}\cdot\iiint \rho(x-x_{\lambda_L},y-y_{\lambda_L},f,\Omega)\cdot\zeta(x-x_\lambda,y-y_\lambda,f,\Omega)dxdyd\Omega.$$

The optical aperture function of optical aperture 406 and the normalized distribution function describing the light intensity distribution for aligned light spot 402 can then be approximated by, $$\rho(x-x_{\lambda_L},y-y_{\lambda_L},f,\Omega)\equiv\mu(x-x_{\lambda_L},y-y_{\lambda_L},f)\Theta(\Omega)\Gamma(r_{\lambda_L}-r),$$

and respectively, $$\zeta(x-x_\lambda,y-y_\lambda,f,\Omega)\equiv\tau(x-x_\lambda,y-y_\lambda,f)\Theta_{FIBER}(\Omega)\Gamma(r_\lambda-r'),$$

where $\Omega_L$ represents the spherical angle of the light intensity distribution of aligned light spot 402, $\Omega_{FIBER}$ represents the numerical aperture of optical aperture 406, and the following formulas apply:

$r=\sqrt{(x-x_{\lambda_L})^2+(y-y_{\lambda_L})^2}$;

$r'=\sqrt{(x-x_\lambda)^2+(y-y_\lambda)^2}$;

$\Gamma(r_{\lambda_L}-r) = \begin{cases} 1 & r_{\lambda_L}-r \geq 0 \\ 0 & r_{\lambda_L}-r < 0 \end{cases}$;

$\Gamma(r_\lambda-r) = \begin{cases} 1 & r_\lambda-r \geq 0 \\ 0 & r_\lambda-r < 0 \end{cases}$;

$\Theta(\Omega) \approx \begin{cases} 1 & \Omega \leq \Omega_L \\ 0 & \Omega > \Omega_L \end{cases}$ (This formula represents the angular distribution function of aligned light spot 402);

$\Theta_{FIBER}(\Omega) \approx \begin{cases} 1 & \Omega \leq \Omega_{FIBER} \\ 0 & \Omega > \Omega_{FIBER} \end{cases}$ (This formula represents the numerical function of optical aperture 406);

$x_\lambda = f \tan \theta(\lambda)$;

$y_\lambda = 0$;

$x_{\lambda_L} = f \tan \theta(\lambda_L)$; and $y_{\lambda_L} = 0$.

($r_\lambda$, $r_{\lambda_L}$ and $r_0$ have been previously defined).

Figure 5:
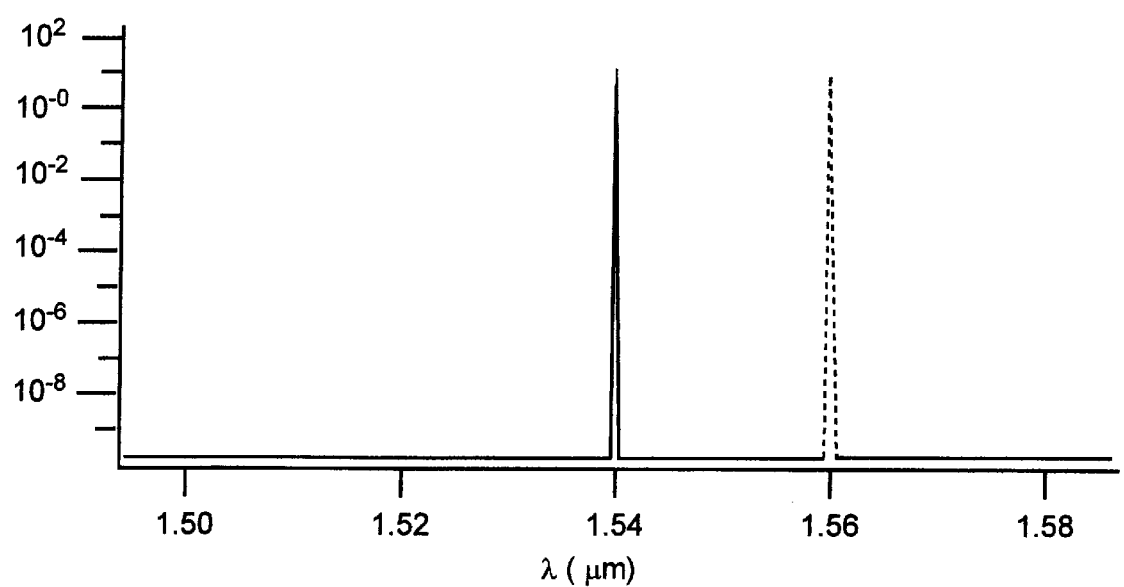
FIG. 5 shows a simulation of the effectiveness of SSE and ASE filtering achieved by an embodiment of the present invention.

FIG. 5 shows a simulation of the effectiveness of SSE and ASE filtering achieved by an embodiment of the present invention for $r_{\lambda_L} = r_0 0$, $f=1000 \cdot r_0$, $d=1 \mu m$, $\Omega_L \leq \Omega_{FIBER}$ and assuming a Gaussian light intensity distribution for aligned light spot 402. Over the emission band of gain medium 308 of FIG. 3, the present invention filters out SSE and ASE background noise radiation at all wavelengths other than the desired laser wavelength $\lambda_L$, which is shown in FIG. 5 to be approximately 1.54 $\mu m$. Consequently, the only light coupled into waveguiding device 332 is light with the desired wavelength, $\lambda_L$.

The present invention provides numerous advantages over the prior art. For convenience, and to take advantage of the detailed description provided in connection with the embodiment shown in FIG. 3, a number of advantages of the present invention will be discussed here with particular reference to the embodiment of FIG. 3. These advantages, however, may also apply to other embodiments of the present invention disclosed herein. Additionally, embodiments of the present invention may have additional advantages, some of which may be further described below.

An advantage of the embodiment of FIG. 3 is that it provides a means for the low noise laser beam 334 to track the laser wavelength of output laser beam 316 with automatic power coupling control as the wavelength of output laser beam 316 is continuously tuned through a broad range of wavelengths. Alternatively stated, the embodiment of FIG. 3 can maintain a maximum and constant level of light coupled into waveguiding device 332 while the wavelength of output laser beam 316, and implicitly of low noise laser beam 334, is tuned across a wide range of wavelengths. In the embodiment shown in FIG. 3, this advantage is achieved by appropriate selection of the physical dimensions of dual-beam laser system 300.

As shown in FIG. 3, dispersion unit 310 and guiding mirror 322 are mechanically coupled to base 304 such that their normals form an angle $\phi_0$. Beam collector 326 is mechanically coupled to rotatable unit 314 such that its focal axis forms an angle $\Phi_0$ with the normal of tuning reflector 312. As a result, upon reflection off guiding mirror 322, reflected diffraction beam 324 forms an angle $\alpha(\lambda_L)$ with the focal axis of beam collector 326, where $\alpha(\lambda_L) = 180° - 2\phi_0 \pm \Phi_0$.

The angle $\alpha(\lambda_L)$ is maintained constant as rotatable unit 314 pivots around pivot 302 to tune wavelength $\lambda_L$ through a broad range of wavelengths. Consequently, focused light spot 328 can be continuously coupled into waveguiding device 332 while wavelength $\lambda_L$ is tuned.

The automatic wavelength and power tracking features of the present invention could also be achieved through an active tracking system which would move optical coupling device 330 in response to positional variations of focused light spot 328 due to wavelength tuning in the laser system. Such as system might employ a computer system coupled with a light sensor located in the proximity of optical aperture 406. The light sensor would provide feedback data to the computer system to permit dynamic relocation of optical coupling device 330 in response to movement of focused light spot 328 to maintain stable light coupling into waveguiding device 332.

Such a system would be difficult and expensive to implement, however, considering that the optical sensor would have to be inserted into the laser system and located in the proximity of optical aperture 406. Further, optical aperture 406 would have to be independently mobile with respect to rotatable unit 314, thereby requiring a complex mechanical coupling device with full two-dimensional movement capability. Such a coupling device would be difficult to implement considering the high degree of precision required for proper optical alignment of optical aperture 406 with focused light spot 328. The inclusion of a complex mobile mechanical coupling device for optical aperture 406 would also significantly complicate the design and functionality of rotatable unit 314, whose pivoting around pivot 302 must be accurately controlled but is highly sensitive to the mass and moment of the components coupled to rotatable unit 314. In contrast, the present invention provides a system which automatically tracks and fully couples focused light spot 328 into optical aperture 406 without any active tracking components, therefore circumventing the limitations associated with an active tracking system.

Another advantage of the embodiment of FIG. 3 is that it may suppress SSE and ASE noise in a laser output of a grating-tuned, external cavity laser system. Referring to FIG. 3, the SSE and ASE noise present in the laser beam generated by gain medium 308 and plane reflector 306 is dispersed upon its incidence on dispersion unit 310. Since most of the SSE and ASE noise consists of light with wavelengths that are different from the desired laser wavelength and cover the entire emission band of gain medium 308, the grating dispersion redirects angularly-separated SSE 336 and angularly-separated ASE 338 in propagation directions divergent from the propagation path of reflected diffraction beam 320. Coupling unit 390, which comprises guiding mirror 322, beam collector 326 and optical coupling device 330, translates the angular separation of these beam propagation directions into a spatial distribution of light beam energy, which is coupled into waveguiding device 332 to generate low noise laser beam 334. Consequently, the embodiment of FIG. 3 produces low noise laser beam 334 which is essentially free of SSE and ASE background noise.

Yet another advantage of the embodiment of FIG. 3 is that it provides an additional laser beam output for grating-tuned, external cavity laser systems by recovering optical energy traditionally wasted by grating-tuned, external cavity laser systems in the prior art and efficiently employing it in a novel approach to generate a non-conventional laser beam with an extremely low level of SSE and ASE noise. This additional laser beam is tuned at the same laser wavelength as the conventional laser beam, but exits the laser system through a separate output port.

A further advantage of the embodiment of FIG. 3 is that it provides a significant number of benefits without interfering with the functionality and classic design of conventional grating-tuned, external cavity laser systems. More specifically, since the embodiment of FIG. 3 generates low noise laser beam 334 by recycling previously-wasted optical energy, the power and general characteristics of output laser beam 316 are generally not affected. Additionally, the embodiment of FIG. 3 deviates from the classic design of conventional grating-tuned, external cavity laser systems only minimally, therefore decreasing the cost and uncertainties associated with radical design alterations.

Figure 6:
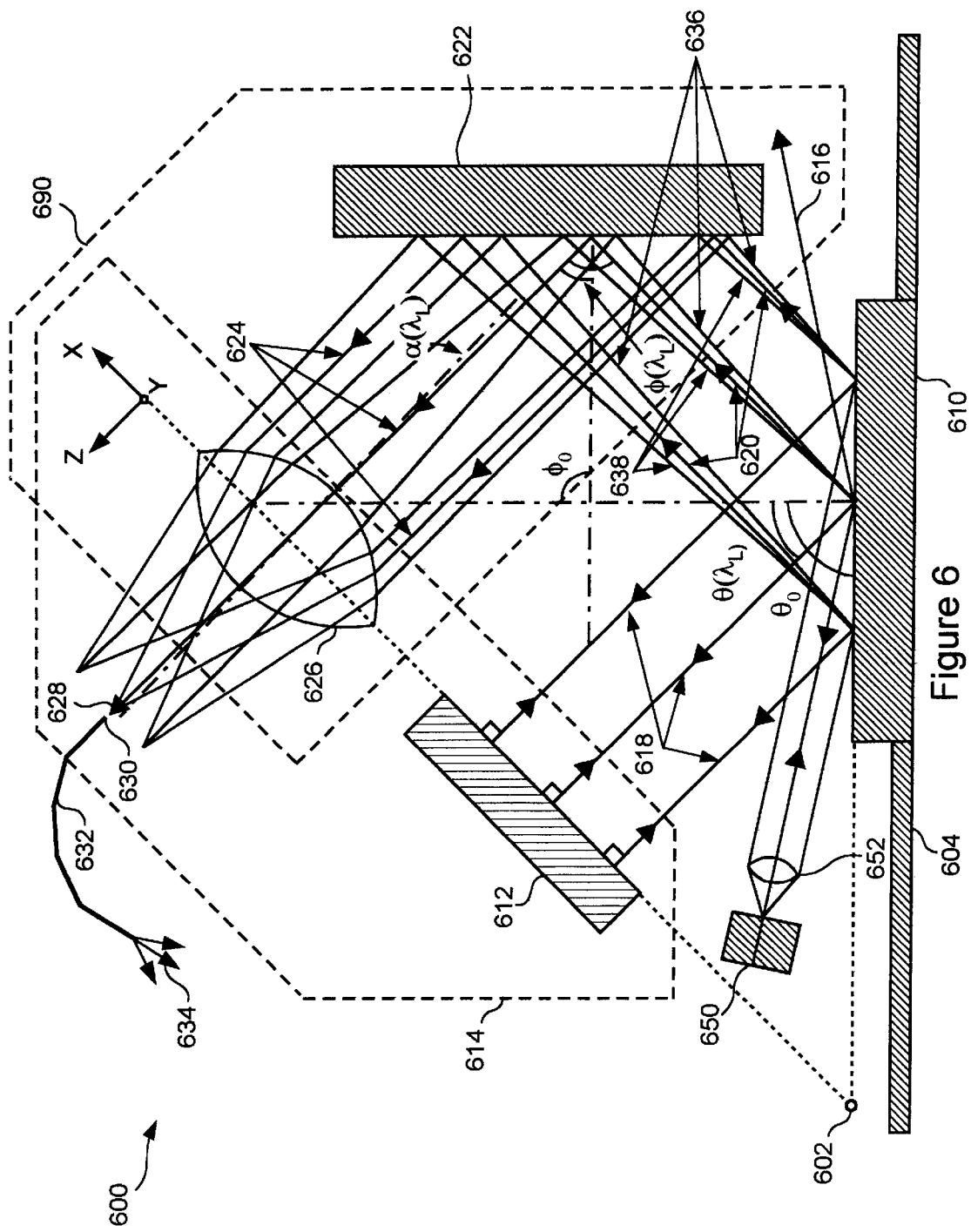
FIG. 6 shows another embodiment of the present invention with a laser diode acting as a light source and a collimation lens acting as a light collimating device.

FIG. 6 shows an alternative embodiment of the present invention. Dual-beam laser system 600 comprises pivot 602, base 604, dispersion unit 610, tuning reflector 612, rotatable unit 614, output laser beam 616, first-order diffracted radiation 618, reflected diffraction beam 620, guiding mirror 622, collector incident light 624, beam collector 626, focused light spot 628, optical coupling device 630, waveguiding device 632, low noise laser beam 634, angularly-separated SSE 636, angulary-separated ASE 638, laser diode 650 and collimation lens 652.

The structure of the embodiment shown in FIG. 6 is substantially identical with the structure of the embodiment shown in FIG. 3 except that the embodiment of FIG. 6 employs a laser diode 650 to replace the combination of the plane reflector 306 and the gain medium 308 from FIG. 3 and introduces a collimation lens 652 disposed along an optical path between laser diode 650 and dispersion unit 610. Since the output of laser diode 650 generally exhibits an undesirable elliptically-divergent shape, collimation lens 652 is employed to collimate the light incident on dispersion unit 610 at a grazing angle. In a preferred embodiment, both facets of collimation lens 652 are treated with an anti-reflection coating to reduce light feedback from internal reflection within collimation lens 652. Further, a facet of laser diode 650 oriented towards dispersion unit 610 is also treated with an anti-reflection coating to maximize power output of laser diode 650.

In operation, the embodiment of FIG. 6 functions substantially the same as the embodiment of FIG. 3 because the light beam generated by laser diode 650 in conjunction with collimation lens 652 is substantially identical with the light beam produced by gain element 308 and plane reflector 306. Consequently, the light incident at a grazing angle on diffraction grid 610 is substantially identical with the light incident at a grazing angle on diffraction grid 310, and therefore the description provided for the embodiment of FIG. 3 generally applies to the embodiment of FIG. 6.

Figure 7:
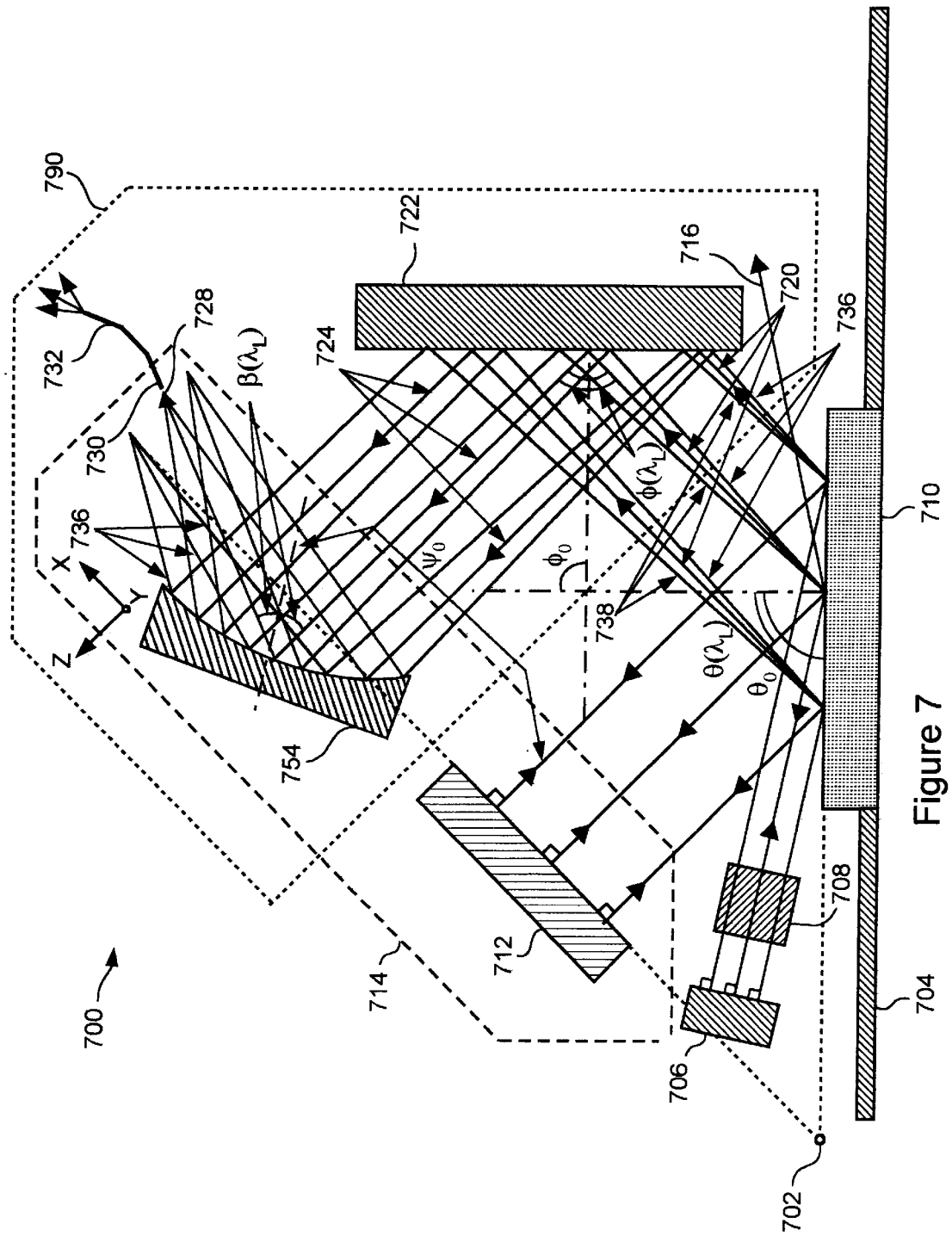
FIG. 7 shows another embodiment of the present invention with a concave mirror acting as a beam collector.

FIG. 7 shows another alternative embodiment of the present invention. Dual-beam laser system 700 comprises pivot 702, base 704, plane reflector 706, gain medium 708, dispersion unit 710, tuning reflector 712, rotatable unit 714, output laser beam 716, first-order diffracted radiation 718, reflected diffraction beam 720, guiding mirror 722, mirror incident light 724, focused light spot 728, optical coupling device 730, waveguiding device 732, low noise laser beam 734 angularly-separated SSE 736, angulary-separated ASE 738, and concave mirror 754.

The structure of the embodiment of FIG. 7 is substantially identical with the structure of the embodiment of FIG. 3, except that the embodiment of FIG. 7 substitutes a concave mirror 754 for beam collector 326. Concave mirror 754 is mechanically coupled to rotatable unit 714 such that a concave reflective surface of concave mirror 754 is oriented in the general direction of guiding mirror 722 to intercept mirror incident light 724. Optical coupling device 730 and waveguiding device 732 are mechanically coupled to rotatable unit 714 on the same side of concave mirror 754 as guiding mirror 722.

In operation, the embodiment shown in FIG. 7 functions substantially the same as the embodiment of FIG. 3. Mirror incident light 724 is substantially identical with collector incident light 324 from FIG. 3. Unlike in the embodiment of FIG. 3, however, mirror incident light 724 is not refracted by beam collector 326, which comprises a lens, but is instead reflected by concave mirror 754.

Concave mirror 754 is designed to reflect and focus mirror incident light 724 in a pattern substantially identical with the pattern experienced by the light refracted by beam collector 326 in the embodiment of FIG. 3. Consequently, concave mirror 754 reflects and concentrates mirror incident light 724 into focused light spot 728 which is substantially identical to focused light spot 328 of FIG. 3. The optical axis of concave reflection mirror 754 forms an angle $\psi_0$ with the normal of tuning reflector 712. To take advantage of the spatial filtering technique previously discussed in connection with the embodiment of FIG. 3, optical coupling device 730 is mechanically coupled to rotatable unit 714 such that focused light spot 728 is coupled into optical coupling device 330.

Upon reflection by concave mirror 754, reflected diffraction beam 720 propagates at an angle $\beta(\lambda_L)$ with respect to the focal axis of concave mirror 754. Referring to FIG. 7, angle $\beta(\lambda_L)$ can be expressed as, $$\beta(\lambda_L)=180°-2\phi_0\pm\psi_0.$$

As indicated by this formula, angle $\beta(\lambda_L)$ does not exhibit any dependence on wavelength or on the position of rotatable unit 714, but is instead fully determined by initial selection and alignment of the components of dual-beam laser system 700. To ensure full coupling of focused light spot 728 into optical coupling device 730, the area of optical coupling device 730 must be larger than the effective size of focused light spot 728 and the numerical aperture of optical coupling device 730 must be larger than the convergence of focused light spot 728. If these conditions are satisfied, proper initial design of dual-beam laser system 700 results in continuous and stable coupling of selected focused light spot 728 into waveguiding device 732 with simultaneous and effective filtering of SSE and ASE background light in the presence of laser tuning.

Figure 8:
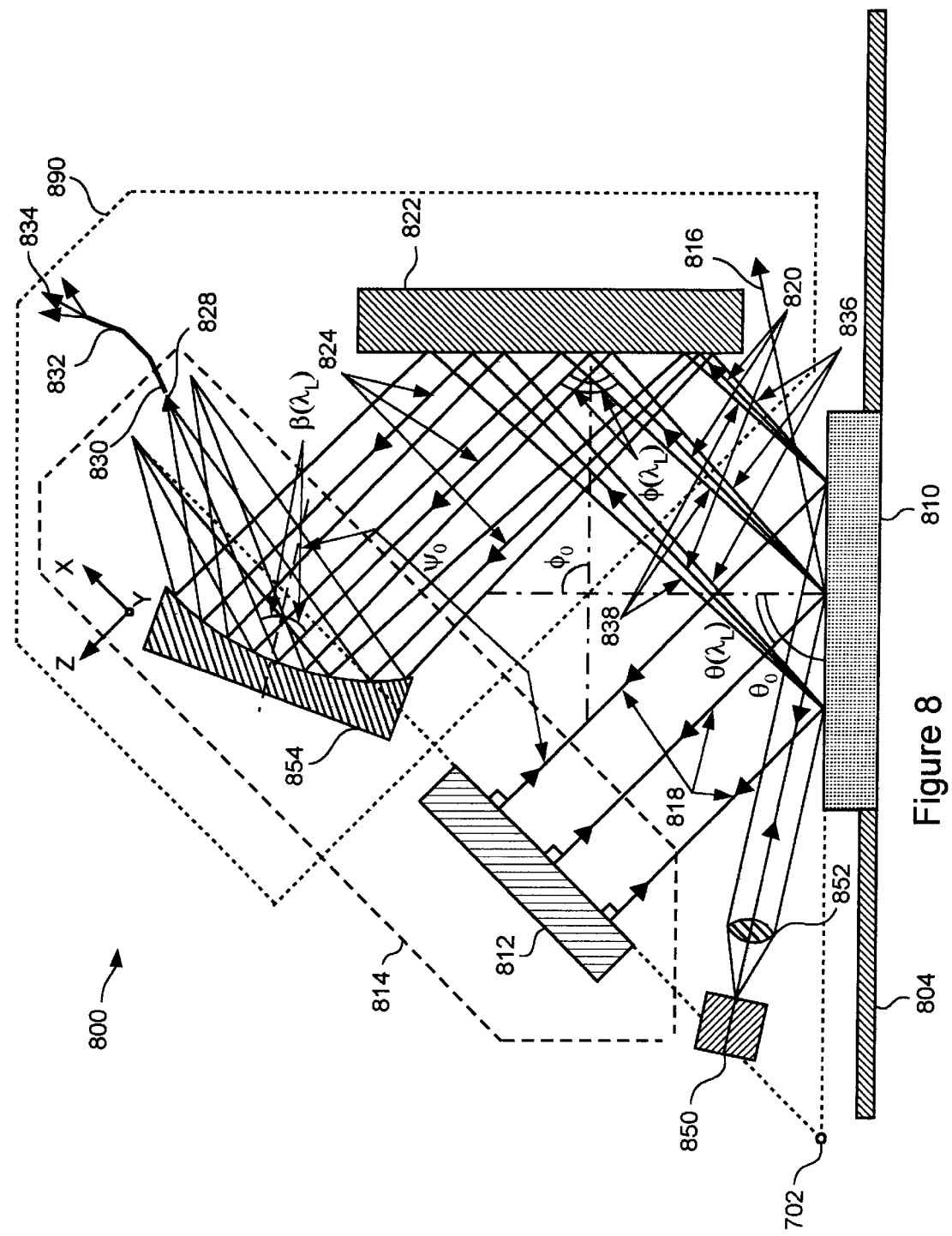
FIG. 8 shows another embodiment of the present invention with a laser diode acting as a light source, a collimation lens acting as a light collimating device and a concave mirror acting as beam collector.

FIG. 8 shows yet another embodiment of the present invention. Dual-beam laser system 800 comprises pivot 802, base 804, dispersion unit 810, tuning reflector 812, rotatable unit 814, output laser beam 816, first-order diffracted radiation 818, reflected diffraction beam 820, guiding mirror 822, collector incident light 824, focused light spot 828, optical coupling device 830, waveguiding device 832, low noise laser beam 834, angularly-separated SSE 836, angulary-separated ASE 838, laser diode 850, collimation lens 852 and concave mirror 854.

The structure of the embodiment shown in FIG. 8 is substantially identical with the embodiment shown in FIG. 3, except that the embodiment of FIG. 8 includes the modifications introduced by the embodiments shown in FIG.

6 and FIG. 7. More specifically, the embodiment of FIG. 8 employs a laser diode 850 to replace the combination of the plane reflector 306 and the gain medium 308 from FIG. 3 and introduces a collimation lens 852 disposed along an optical path between laser diode 850 and dispersion unit 810, as discussed in connection with FIG. 6. Additionally, the embodiment of FIG. 8 substitutes a concave mirror 854 for beam collector 326, as described in conjunction with FIG. 7. In a preferred embodiment, both facets of collimation lens 852 are treated with an anti-reflection coating to reduce light feedback from internal reflection within collimation lens 852. Further, a facet of laser diode 850 oriented towards dispersion unit 810 is also treated with an anti-reflection coating to maximize power output of laser diode 850.

In operation, both modifications operated to the embodiment shown in FIG. 8 perform substantially identical functions as the original elements they replace, as discussed in connection with the embodiments of FIG. 6 and FIG. 7. Consequently, the descriptions provided for the embodiments shown in FIGS. 3, 6 and 7 also apply to the embodiment of FIG. 8.

Figure 9:
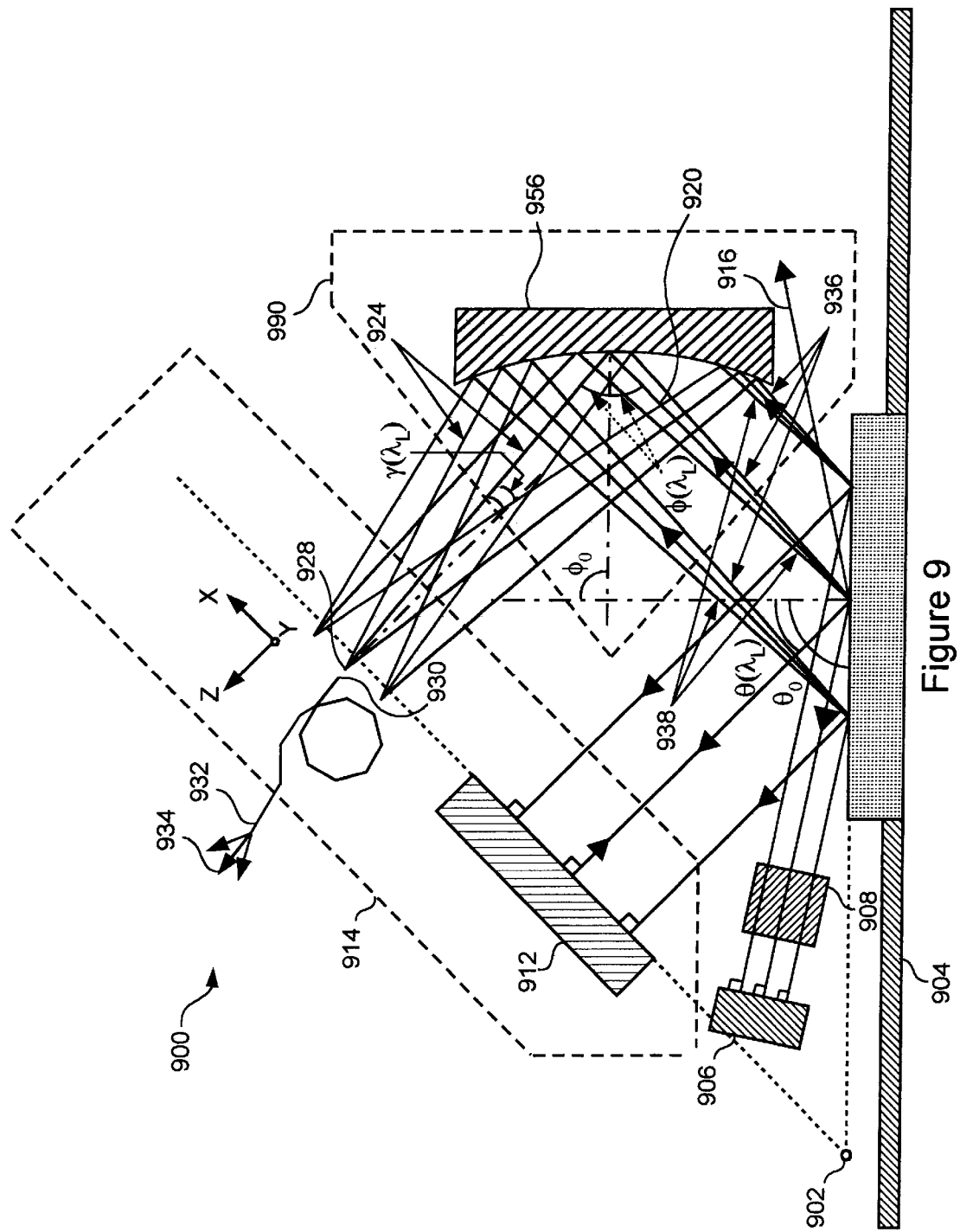
FIG. 9 shows another embodiment of the present invention with a concave mirror acting as both a guiding element and a beam collector.

FIG. 9 shows yet another embodiment of the present invention. Dual-beam laser system 900 comprises pivot 902, base 904, plane reflector 906, gain medium 908, dispersion unit 910, tuning reflector 912, rotatable unit 914, output laser beam 916, first-order diffracted radiation 918, reflected diffraction beam 920, mirror incident light 924, focused light spot 928, optical coupling device 930, waveguiding device 932, low noise laser beam 934, angularly-separated SSE 936, angulary-separated ASE 938, and concave guiding mirror 956.

The structure of the embodiment shown in FIG. 9 is substantially identical with the structure of the embodiment shown in FIG. 3, except that the embodiment of FIG. 9 employs a concave guiding mirror 956 to replace both guiding mirror 322 and beam collector 326 of FIG. 3. Concave guiding mirror 956 is mechanically coupled to base 904 such that its concave reflecting surface is directed in the general direction of rotatable unit 914 and its optical axis forms an angle $\phi_0$ with respect to the normal of dispersion unit 910.

In operation, the embodiment shown in FIG. 9 functions substantially the same as the embodiment of FIG. 3. Concave mirror 956 is designed to reflect and focus reflected diffraction beam 920 in a pattern substantially identical with the pattern exhibited by collector incident light 324 upon its refraction by beam collector 326 in the embodiment of FIG. 3. Essentially, concave guiding mirror 956 is designed to operationally substitute both guiding mirror 322 and beam collector 326 of FIG. 3. Consequently, concave guiding mirror 956 reflects and concentrates reflected diffraction beam 920 into focused light spot 928 which is substantially identical with focused light spot 328 from FIG. 3. Analogously with the arrangement of FIG. 3, optical coupling device 930 is mechanically coupled to rotatable unit 914 such that it is oriented in the direction of concave guiding mirror 956 and is aligned to permit coupling of focused light spot 928 into optical coupling device 930.

Upon reflection by concave guiding mirror 956, reflected diffraction beam 924 forms an angle $\gamma(\lambda_L)$ with the normal of tuning reflector 912, where $$\Theta(\lambda_L) = 180° - 2\phi_0.$$

As indicated by this formula, angle $\gamma(\lambda_L)$ does not exhibit any dependence on wavelength or on the position of rotatable unit 914, but is instead fully determined by initial selection and alignment of the components of dual-beam laser system 900. Proper initial design of dual-beam laser system 900 results in continuous coupling of focused light spot 928 into optical coupling device 930 with simultaneous and effective filtering of SSE and ASE background light regardless of wavelength variations in the system as a result of laser tuning.

The particular arrangement of the embodiment of FIG. 9 results in an advantage. Specifically, as rotatable unit 914 pivots around pivot 902, the distance between concave guiding mirror 956 and optical coupling device 930 varies because optical coupling device 930 is attached to, and moves together with, rotatable unit 914. Consequently, since the focal length of concave guiding mirror 956 is fixed, and since optical coupling device 930 is initially located in the focal plane of concave mirror 956, pivoting of rotatable unit 914 removes optical coupling device 930 from the focal plane of concave guiding mirror 956. As a result, due to the inherent divergence of the light reflected by concave guiding mirror 956, the size of focused light spot 328 will increase as it projects upon the optical coupling device 930 out of focus. This general concept may be applied to other embodiments of the present invention.

To maximize the amount of optical power coupled into waveguiding device 932, the area of optical coupling device 930 must be larger than the effective size of focused light spot 328, and the numerical aperture of optical coupling device 930 must be larger than the convergence of focused light spot 328. Depending on the amplitude of movement of rotatable unit 914, however, the size of focused light spot 928 could potentially exceed the effective size of optical coupling device 930, therefore resulting in reduced coupling efficiency. This apparent inconvenience can be remedied by simultaneously moving optical coupling device 930 along the optical axis of concave guiding mirror 956 to compensate for any focal plane translation induced by pivoting of rotatable unit 956.

Figure 10:
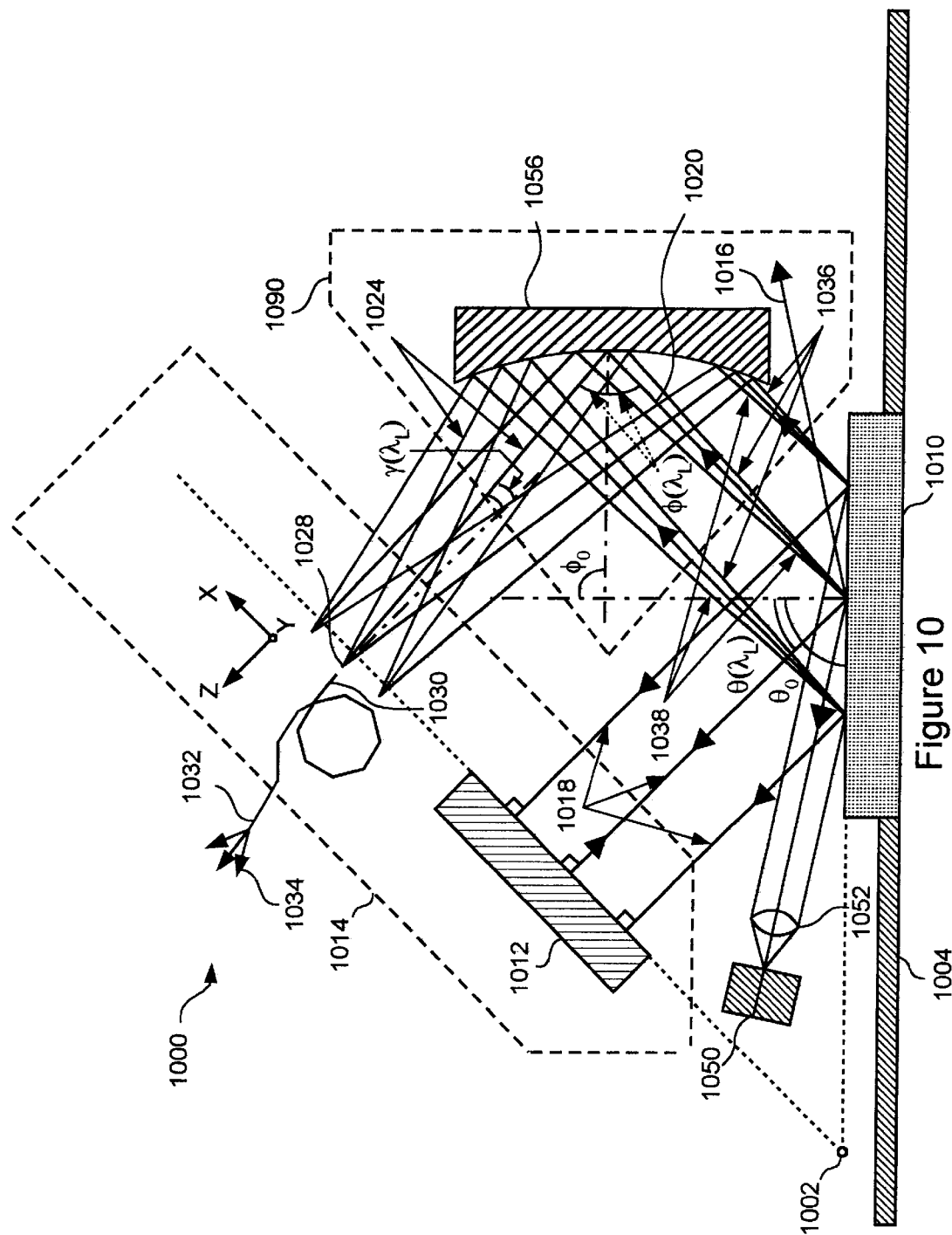
FIG. 10 shows another embodiment of the present invention with a laser diode acting as a light source, a collimation lens acting as a light collimating device and a concave mirror acting as both a guiding element and beam collector.

FIG. 10 shows an alternative embodiment of the present invention. Dual-beam laser system 1000 comprises pivot 1002, base 1004, dispersion unit 1010, tuning reflector 1012, rotatable unit 1014, output laser beam 1016, first-order diffracted radiation 1018, reflected diffraction beam 1020, mirror incident light 1024, focused light spot 1028, optical coupling device 1030, waveguiding device 1032, low noise laser beam 1034, angularly-separated SSE 1036, angulary-separated ASE 1038, laser diode 1050, collimation lens 1052 and concave guiding mirror 1056.

The structure of the embodiment shown in FIG. 10 is substantially identical with the structure of the embodiment shown in FIG. 9 except that the embodiment of FIG. 10 employs a laser diode 1050 to replace the combination of plane reflector 906 and gain medium 908 from FIG. 9 and introduces a collimation lens 1052 disposed along an optical path between laser diode 1050 and dispersion unit 1010. Since the output of laser diode 1050 generally exhibits an undesirable elliptically-divergent shape, collimation lens 1052 is employed to collimate the light incident on dispersion unit 1010 at a grazing angle. In a preferred embodiment, both facets of collimation lens 1052 are treated with an anti-reflection coating to reduce light feedback from internal reflection within collimation lens 1052. Further, a facet of laser diode 1050 oriented towards dispersion unit 1010 is also treated with an anti-reflection coating to maximize power output of laser diode 1050.

In operation, the embodiment of FIG. 10 functions substantially the same as the embodiment of FIG. 9 because the light beam generated by laser diode 1050 in conjunction with collimation lens 1052 is substantially identical with the light beam produced by gain element 908 and plane reflector 906. Consequently, the light incident at a grazing angle on diffraction grid 1010 is substantially identical with the light incident at a grazing angle on diffraction grid 910, and therefore the description provided for the embodiment of FIG. 9 also applies to the embodiment of FIG. 10.

Figure 11:
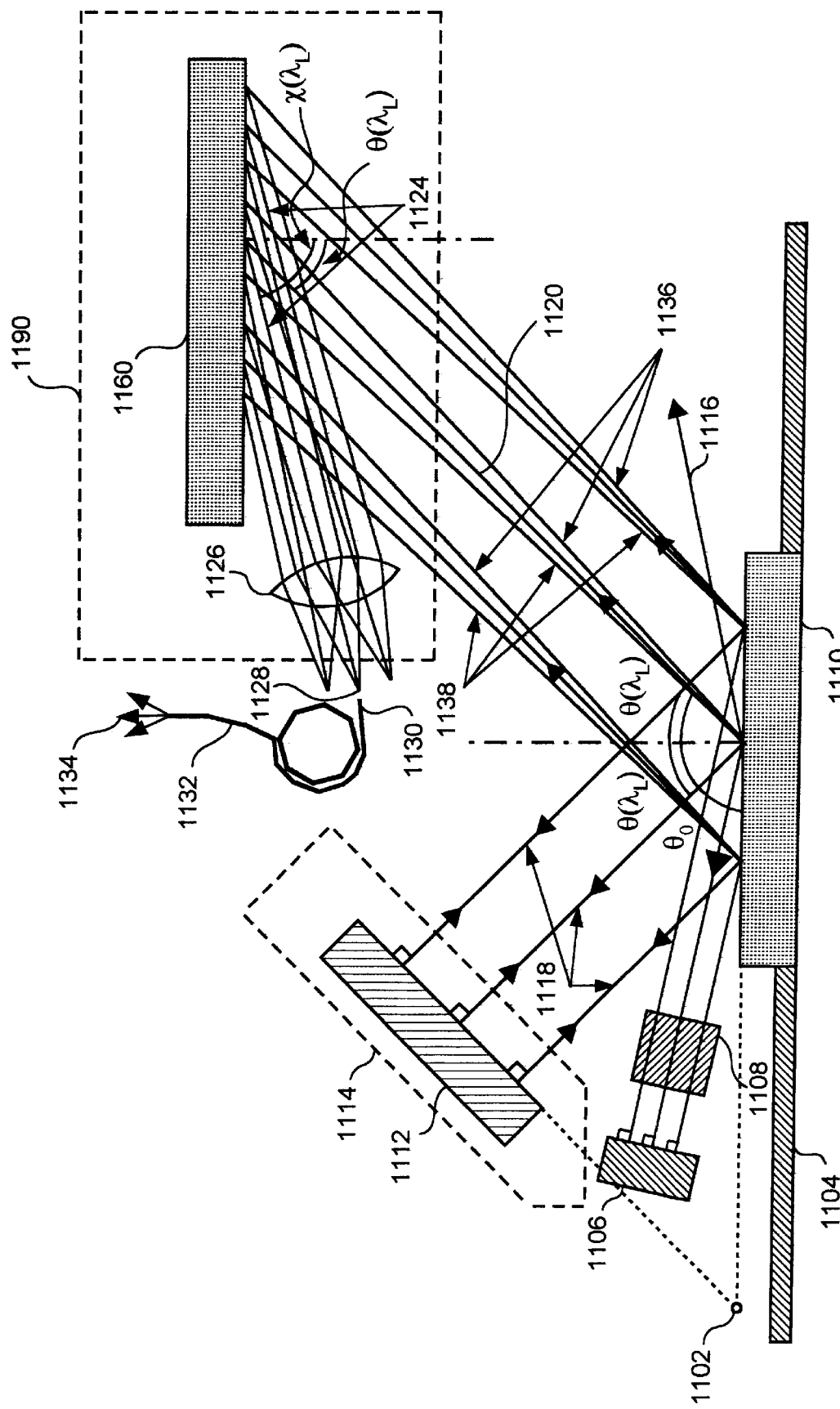
FIG. 11 shows another embodiment of the present invention with a dispersion unit acting as both a guiding element and beam collector.

FIG. 11 shows yet another alternative embodiment of the present invention. Dual-beam laser system 1100 comprises pivot 1102, base 1104, plane reflector 1106, gain medium 1108, dispersion unit 1110, tuning reflector 1112, rotatable unit 1114, output laser beam 1116, first-order diffracted radiation 1118, reflected diffraction beam 1120, beam collector incident light 1124, beam collector 1126, focused light spot 1128, optical coupling device 1130, waveguiding device 1132, low noise laser beam 1134, angularly-separated SSE 1136, angulary-separated ASE 1138, and guiding dispersion unit 1160.

The structure of the embodiment of FIG. 11 is substantially identical with the structure of the embodiment of FIG. 3, except that in the embodiment of FIG. 11 a guiding dispersion unit 1160 substitutes guiding mirror 322 of FIG. 3 and beam collector 1126, optical coupling device 1130 and waveguiding device 1132 are removed from rotatable unit 1114. Guiding dispersion unit 1160 is mounted to the base 1104, and substantially parallel with, dispersion unit 1110, and is oriented towards dispersion unit 1110 to intercept reflected diffraction beam 1120. Beam collector 1126, optical coupling device 1130 and waveguiding device 1132 are mounted above dispersion unit 1110 and are fixed with respect to guiding dispersion unit 1160.

In operation, the embodiment shown in FIG. 11 functions substantially the same as the embodiment of FIG. 3. Reflected diffraction beam 1120 is substantially identical with reflected diffraction beam 320 from FIG. 3. Unlike in the embodiment of FIG. 3, however, reflected diffraction beam 1120 is not reflected by guiding mirror 322, but is instead diffracted by guiding dispersion unit 1160.

Guiding dispersion unit 1160 is designed to diffract reflected diffraction beam 1120 in a pattern substantially identical with the pattern experienced by the light reflected by guiding mirror 322 in the embodiment of FIG. 3. Consequently, beam collector incident light 1124 is substantially identical with beam collector incident light 324 from FIG. 3. As a result, beam collector 1126 refracts and focuses beam collector incident light 1124 into focused light spot 1128 which is substantially identical to focused light spot 328 of FIG. 3.

Reflected diffraction beam 1124, which is comprised in collector incident radiation 1124 forms an angle $\chi(\lambda_L)$ with the normal of guiding dispersion unit 1160, where $\chi(\lambda_L)=\theta_0$.

As indicated by this formula, angle $\chi(\lambda_L)$ does not exhibit any dependence on wavelength or on the position of rotatable unit 1114, but is instead fully determined by initial selection and alignment of the components of dual-beam laser system 1100. To ensure full coupling of focused light spot 1128 into optical coupling device 1130, the area of optical coupling device 1130 must be larger than the effective size of focused light spot 1128 and the numerical aperture of optical coupling device 1130 must be larger than the convergence of focused light spot 1128. If these conditions are satisfied, proper initial design of dual-beam laser system 1100 results in continuous and stable coupling of selected focused light spot 1128 into waveguiding device 1132 with simultaneous and effective filtering of SSE and ASE background light regardless of wavelength variations in the system as a result of laser tuning.

Figure 12:
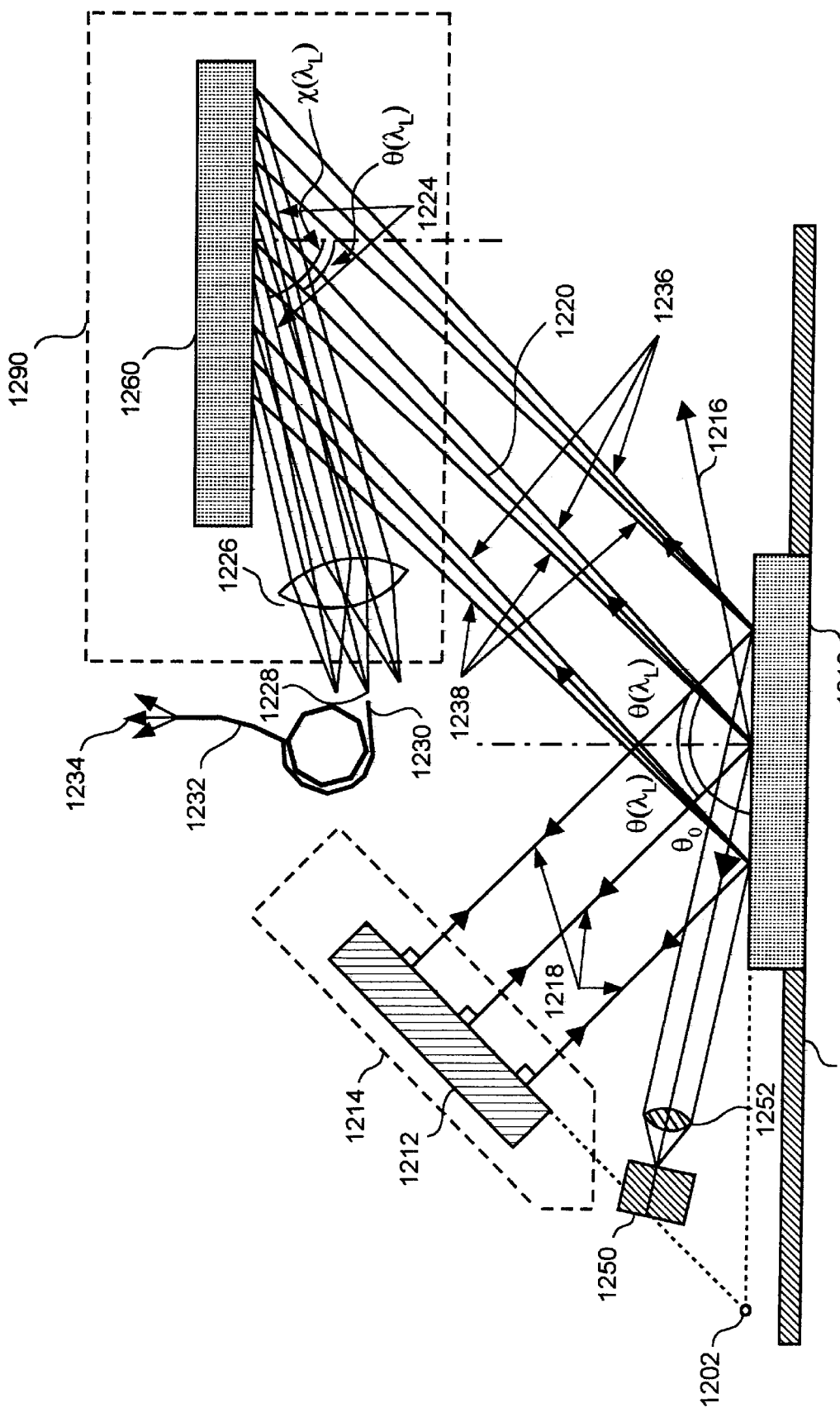
FIG. 12 shows another embodiment of the present invention with a laser diode acting as a light source, a collimation lens acting as a light collimating device and a dispersion unit acting as both a guiding element and beam collector.

FIG. 12 shows an alternative embodiment of the present invention. Dual-beam laser system 1200 comprises pivot 1202, base 1204, plane reflector 1206, gain medium 1208, dispersion unit 1210, tuning reflector 1212, rotatable unit 1214, output laser beam 1216, first-order diffracted radiation 1218, reflected diffraction beam 1220, beam collector incident light 1224, beam collector 1226, focused light spot 1228, optical coupling device 1230, waveguiding device 1232, low noise laser beam 1234, angularly-separated SSE 1236, angulary-separated ASE 1238, laser diode 1250, collimation lens 1252 and guiding dispersion unit 1260.

The structure of the embodiment shown in FIG. 12 is substantially identical with the structure of the embodiment shown in FIG. 11 except that the embodiment of FIG. 12 employs a laser diode 1250 to replace the combination of plane reflector 1106 and gain medium 1108 from FIG. 11 and introduces a collimation lens 1252 disposed along an optical path between laser diode 1250 and dispersion unit 1210. Since the output of laser diode 1250 generally exhibits an undesirable elliptically-divergent shape, collimation lens 1252 is employed to collimate the light incident on dispersion unit 1210 at a grazing angle. In a preferred embodiment, both facets of collimation lens 1252 are treated with an anti-reflection coating to reduce light feedback from internal reflection within collimation lens 1252. Further, a facet of laser diode 1250 oriented towards dispersion unit 1210 is also treated with an anti-reflection coating to maximize power output of laser diode 1250.

In operation, the embodiment of FIG. 12 functions substantially the same as the embodiment of FIG. 11 because the light beam generated by laser diode 1250 in conjunction with collimation lens 1252 is substantially identical with the light beam produced by gain element 1108 and plane reflector 1106. Consequently, the light incident at a grazing angle on diffraction grid 1210 is substantially identical with the light incident at a grazing angle on diffraction grid 1110, and therefore the description provided for the embodiment of FIG. 11 also applies to the embodiment of FIG. 12.

Figure 13:
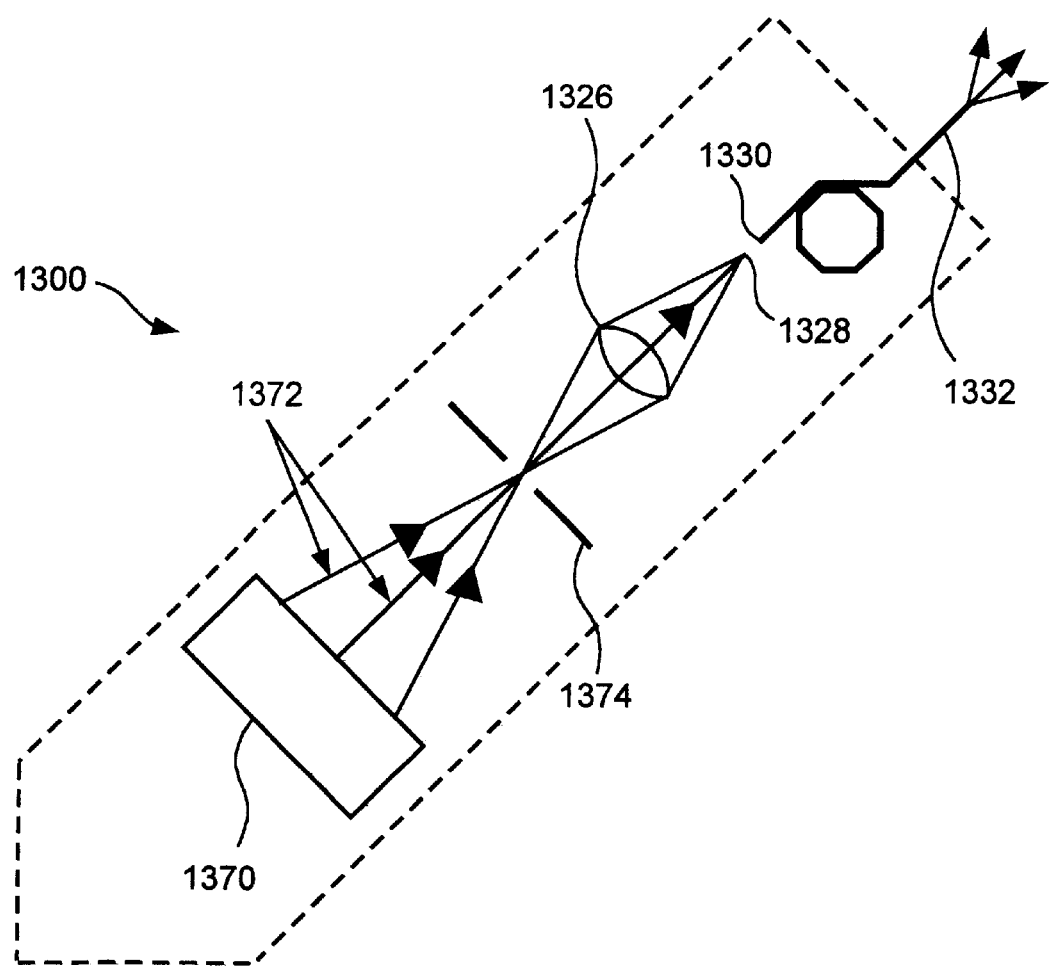
FIG. 13 shows another embodiment of the present invention with an optical transmission pinhole acting as a narrow, band-pass filter.

FIG. 13 shows yet another embodiment of the present invention. The preceding description of various embodiments of this invention taught how an optical aperture coupled to a waveguiding device can be employed as a spatial narrow band-pass filter to suppress SSE and ASE background light with wavelengths other than a desired wavelength. The embodiment of FIG. 13 illustrates how an optical transmission pinhole can be employed as a narrow band-pass filter to either replace or supplement and enhance the filtering effect of an optical coupling device.

FIG. 13 shows a simplified representation of the complete laser system described in prior embodiments. Laser system 1300 includes light generator 1370, pinhole incident light 1372, pinhole 1374, beam collector 1326, focused light spot 1328, optical coupling device 1330 and waveguiding device 1332.

Light generator 1370 and optical coupling device 1330 are mounted at opposite ends of laser system 1300. Referring to the embodiment of FIG. 3 for example, light generator 1370 could include a subsystem comprising plane reflector 306, gain medium 308, dispersion unit 310, tuning reflector 312 and guiding mirror 322. Pinhole 1374 and beam collector 1326 are disposed along an optical path between light generator 1370 and optical coupling device 1330 such that optical aperture 1330 is located distally from light generator 1370 with respect to pinhole 1374. In an alternative embodiment, beam collector 1326 could be replaced by a concave mirror, as disclosed in the embodiment shown in FIG. 7 for example. Optical aperture 1330 is operationally connected to waveguiding device 1332 to permit coupling of light.

In operation, light generator 1370 projects pinhole incident light 1372 towards pinhole 1374. Pinhole 1374 includes a transparent area which permits part of pinhole incident light 1372 to propagate beyond pinhole 1374 and illuminate beam collector 1326. Beam collector 1326 focuses the incident light radiation into focused light spot 1328 which is pre-aligned with optical coupling device 1330 to permit efficient light coupling into waveguiding device 1332. Pinhole 1374 acts as a physical spatial narrow band-pass filter effectively suppressing SSE and ASE background light, and therefore provides a first-order filtering stage for light propagating towards beam collector 1326. Consequently, the light incident on beam collector 1326 is already filtered prior to being concentrated into focused light spot 1328. This advantage could be employed, among others, to relax the design constraints imposed on the optical characteristics of beam collector 1326 and the alignment requirements associated with narrow band-pass filtering as taught by the present invention. Further, the SSE and ASE radiation may be cut off by the spatial filter so that a broader optical coupling device 1330 is still adequate to couple the laser beam into waveguiding device 1332. A larger receiving aperture decreases the probability that optical coupling device 1330 is damaged by the heat produced by the high optical energy being coupled into waveguiding device 1332.

Figure 14:
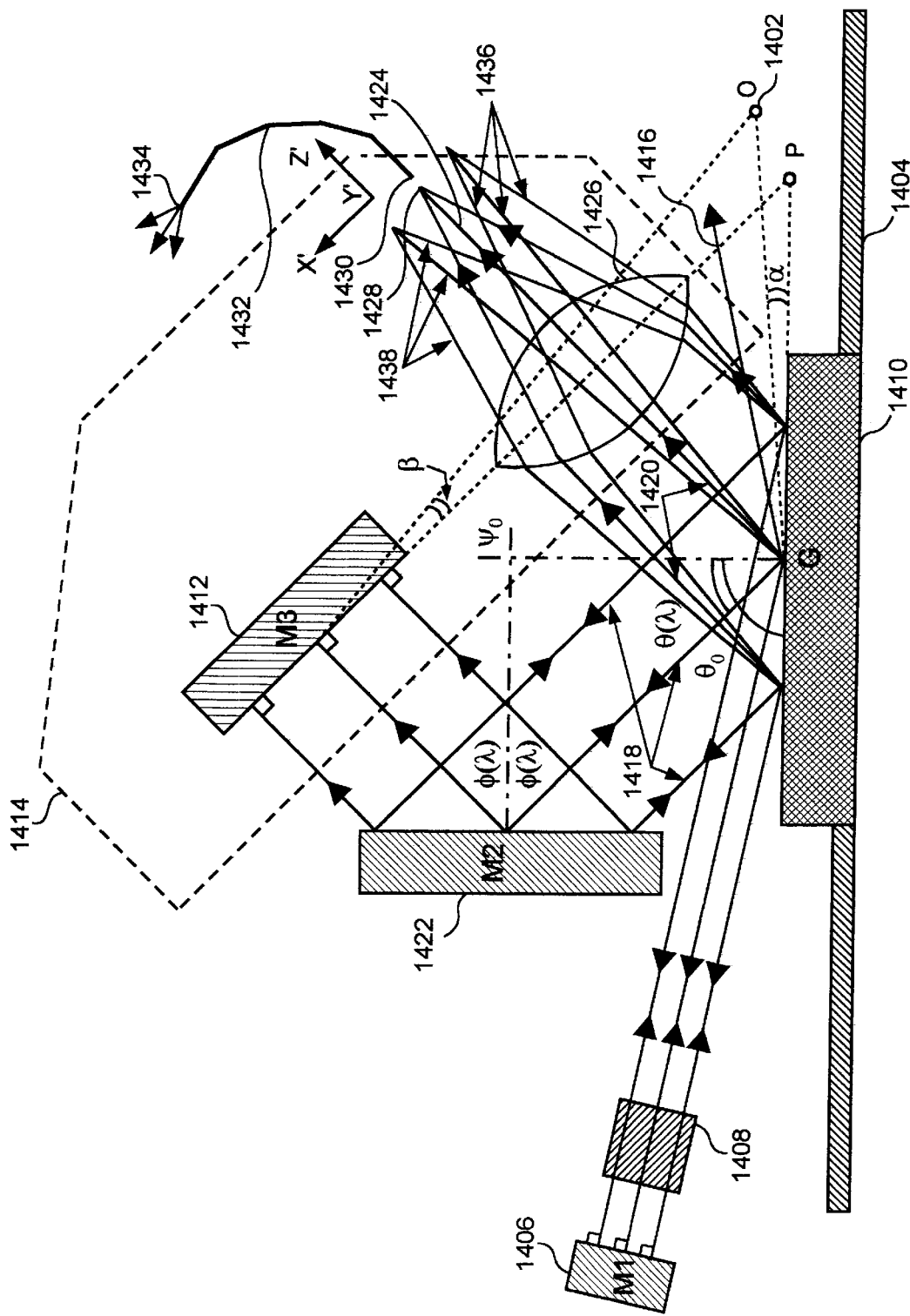
FIG. 14 shows another embodiment of the present invention with an alternative disposition of certain elements.

FIG. 14 shows yet another embodiment of the present invention. Dual-beam laser system 1400 comprises pivot 1402, base 1404, plane reflector 1406, gain medium 1408, dispersion unit 1410, tuning reflector 1412, rotatable unit 1414, output laser beam 1416, first-order diffracted radiation 1418, reflected diffraction beam 1420, guiding mirror 1422, collector incident light 1424, beam collector 1426, focused light spot 1428, optical coupling device 1430, waveguiding device 1432, angularly-separated SSE 1436, angularly-separated ASE 1438, and low noise laser beam 1434.

The structure of the embodiment shown in FIG. 14 is substantially identical with the structure of the embodiment shown in FIG. 3, except that the relative position of a number of elements is changed in FIG. 14. Specifically, beam collector 1426 is mechanically coupled to rotatable unit 1414 proximally to pivot 1402 with respect to tuning reflector 1412. In contrast, in the embodiment of FIG. 3, beam collector 326 is mechanically coupled to rotatable unit 314 distally from tuning reflector 312 with respect to pivot 302. Additionally, in the embodiment of FIG. 14, dispersion unit 1410 is disposed between gain medium 1408 and pivot 1402, whereas in the embodiment of FIG. 3 gain medium 308 and pivot 302 are collocated on the same side of dispersion unit 310. Further, in the embodiment of FIG. 14, guiding mirror 1422 is disposed between rotatable unit 1414 and gain element 1408, whereas in the embodiment of FIG. 3, both rotatable unit 314 and gain medium 308 are collocated on the same side of guiding mirror 322.

In operation, the embodiment of FIG. 14 functions substantially the same as the embodiment of FIG. 3 except for certain differences associated with the topographical modifications described above. For example, in the embodiment of FIG. 14, the laser cavity of dual-beam laser system 1400 is formed by a feedback path defined by plane reflector 1406, gain medium 1408, dispersion unit 1410, guiding mirror 1422 and tuning reflector 1410 and is denoted as M1-G—M2-M3. In contrast, the corresponding feedback path in FIG. 3 does not include guiding mirror 1422.

Figure 15:
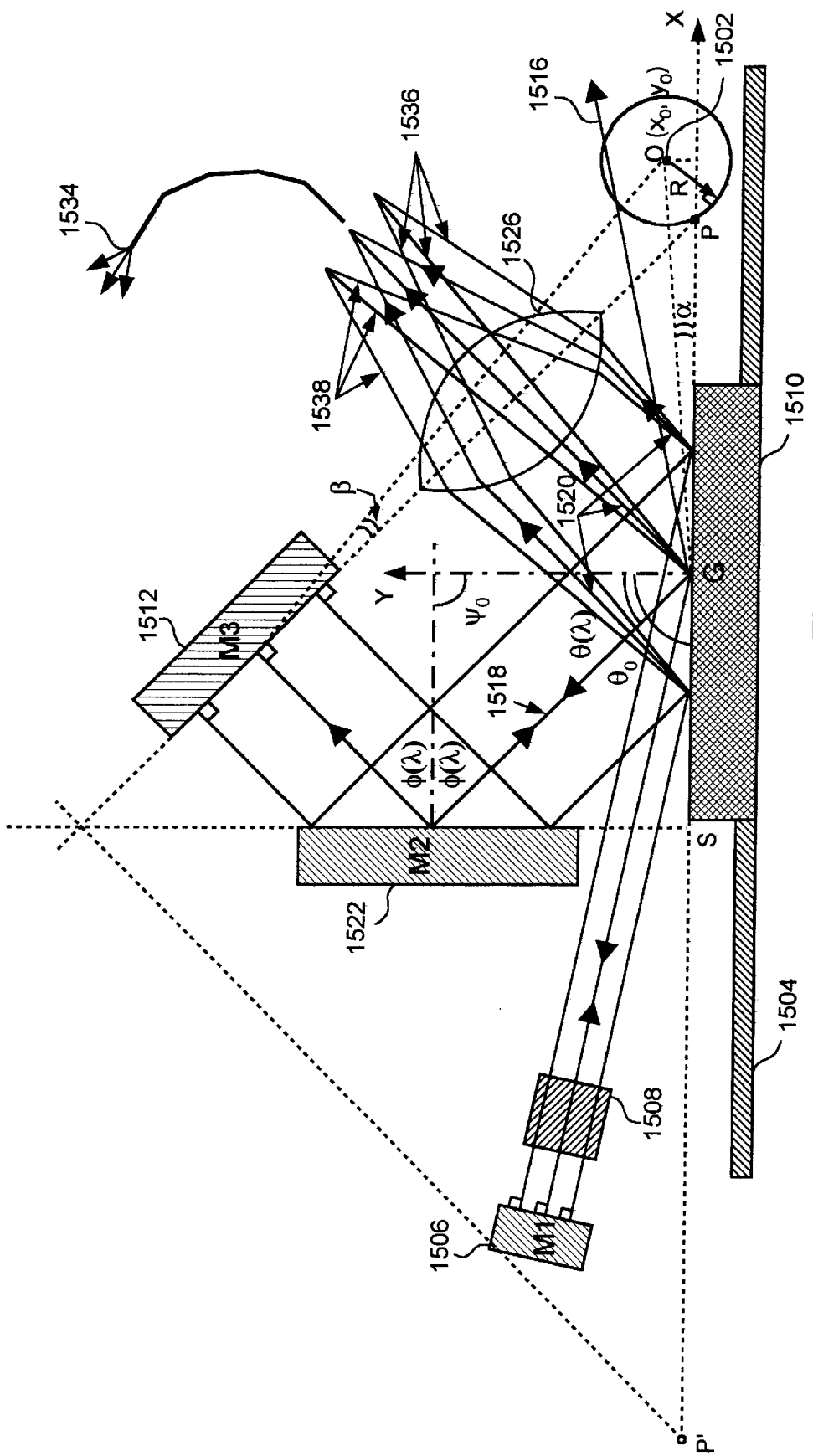
FIG. 15 shows a schematic representation of the embodiment of FIG. 14.

FIG. 15 provides a simplified schematic diagram for the embodiment shown in FIG. 14 together with a number of geometrical relationships existing between various elements of that embodiment. Dual-beam laser system 1500 comprises pivot 1502, base 1504, plane reflector 1506, gain medium 1508, dispersion unit 1510, tuning reflector 1512, rotatable unit 1514, output laser beam 1516, first-order diffracted radiation 1518, reflected diffraction beam 1520 and guiding mirror 1522.

The X-Y coordinate system in FIG. 15 is defined such that the Y-axis coincides with the normal of dispersion unit 1510 and points away from dispersion unit 1510, while the X-axis lies in the plane of the diffracting surface of dispersion unit 1510. The origin of the X-Y coordinate space is denoted at point G. The center of tuning reflector 1512 is denoted as point T.

Pivot 1502 is denoted as point O and has X-Y coordinates $(x_0, y_0)$. The distance between points O and G is denoted $L_O$. Similarly, the distance between points S and G is denoted $L_d$. Further, the distance between points O and T is denoted as $L_R$.

For mode-hop-free laser tuning while rotatable unit 1514 pivots around pivot 1502, the total length $L(\lambda)$ of laser cavity M1-G—M2-M3 must stay constant over the whole range of tunable wavelengths and must be an integer multiple of the mode number, i.e.

$$L(\lambda) = N\lambda/2.$$

The laser wavelength $\lambda$ must satisfy the $m^{th}$-order diffraction equation for dispersion unit 1510, $$m\lambda = d[\sin\theta(\lambda) + \sin\theta_0],$$

where $\theta_0$ represents the angle of incidence of the laser beam generated by gain medium 1508 and plane reflector 1506 on dispersion unit 1510 and d represents the spatial grating period of dispersion unit 1510.

For a laser wavelength $\lambda$, the total cavity length $L(\lambda)$ can be expressed as $$L(\lambda) = |\overline{M_1 G}| + |\overline{GM_2}| + |\overline{M_2 M_3}| + [n_1(\lambda) - 1]d_1,$$

A portion of the M1-G optical path included in this equation is located inside gain medium 1508, whose optical index or dispersion figure is $n_1(\lambda)$.

In an alternative embodiment of the present invention, tuning reflector 1512 may be replaced by a Porro prism. In still another embodiment of this invention, a laser diode and collimation lens may replace plane reflector 1506 and gain medium 1508 as described, for example, in connection with the embodiment shown in FIG. 6. Both of these two alternative embodiments are substantially identical with the embodiment of FIG. 14 from a functional point of view, except that the total cavity length $L(\lambda)$ may vary due to additional dispersion introduced into the optical system.

In general, medium dispersion is a function of light wavelength and may be expressed as, $$n_1(\lambda) = n_{10} + \alpha_1\lambda + \alpha_2\lambda^2 + \alpha_3\lambda^3 + \ldots,$$

where $n_{10}$ represents a constant and a1, a2, . . . represent coefficients associated with higher orders of dispersion. Generally, $$n_{10} \gg \alpha_1\lambda \gg \alpha_2\lambda^2 \gg \alpha_3\lambda^3 \ldots$$

Taking into consideration the dispersion introduced by gain medium 1508 and by any other dispersion-inducing elements present in the embodiment of FIG. 15, the mode number N may be expressed as, $$N = 2m\left\{\frac{(L_o + L_d\cos\alpha)\cos(\alpha + 2\Delta) + L_d(1 + \sin\alpha|\sin\Delta|) + a_1 d_1}{d}\right\} +$$

$$2m\left\{\frac{(L_o + L_d\cos\alpha)\sin(\alpha + 2\Delta) - \frac{L_d\sin\alpha\cos\Delta}{\lambda}}{\lambda}\right\} \cdot$$

$$\sqrt{1 - \left(\frac{\lambda}{d}\sin\theta_0\right)^2} + (a_2\lambda + a_3\lambda^2 + \ldots)\right\} +$$

$$2m\left\{\frac{|\overline{M_1 G}| + (n_{10} - 1)d_1 - L_R\sin\beta - [L_d(1 + \sin\alpha|\sin\Delta|) + (L_o + L_d\cos\alpha)\cos(\alpha + 2\Delta)]\sin\theta_0}{\lambda}\right\}$$

Parameters $\overline{M_1 G}$, $L_0, L_d, L_R$, $\alpha$, $\beta$, $\Delta(\Delta=\psi_0-90°)$ are only dependent on the physical design and static setup of dual-beam laser system 1500 and do not vary as rotatable unit 1514 pivots around pivot 1502. Consequently, for a laser wavelength $\lambda$, the cavity mode number N may be expressed as, $$N=N_0+\Delta N_0+\Delta N(\lambda),$$

where the cavity constant mode number $N_0$ is given by, $$N_0 = 2m\left\{\frac{(L_o + L_d\cos\alpha)\cos(\alpha + 2\Delta) + L_d(1 + \sin\alpha|\sin\Delta|) + a_1 d_1}{d}\right\}.$$

The mode shift $\Delta N_0$ induced by initial alignment and setup of dual-beam laser system 1500 may be expressed as, $$\Delta N_0(\lambda) = 2m\left\{\frac{|\overline{M_1 G}| + (n_{10} - 1)d_1 - L_R\sin\beta - [L_d(1 + \sin\alpha|\sin\Delta|) + (L_o + L_d\cos\alpha)\cos(\alpha + 2\Delta)]\sin\theta}{\lambda}\right\} +$$

$$2m\left\{\frac{(L_o + L_d\cos\alpha)\sin(\alpha + 2\Delta) - \frac{L_d\sin\alpha\cos\Delta}{\lambda}}{\lambda} \cdot \sqrt{1 - \left(\frac{\lambda}{d}\sin\theta_0\right)^2}\right\}$$

Analogously, the cavity mode shift $\Delta N(\lambda)$ induced by dispersion associated with the optical components of dual-beam laser system 1500 is provided by, $$\Delta N(\lambda)=2m(a_2\lambda+a_3\lambda^2+\ldots):$$

Mode-hop-free laser tuning over the entire tuning band of gain medium 1508 and dispersion unit 1510 can be achieved only when $$\Delta N_0(\lambda)+\Delta N(\lambda)=0.$$

This equation suggests that if dual-beam laser system 1500 exhibits sufficiently-high nonlinear dispersion or misalignment, mode-hop-free laser tuning might not be achievable. Mode-hop-free tuning may only be maintained if the $\Delta N_0(\lambda)+\Delta N(\lambda)<<1$ over the entire tuning range.

An advantage of the present invention is that mode-hop free tuning can be achieved by proper selection of certain parameters during the design of dual-beam laser system 1500 such as the position of plane reflector 1506 ($|\overline{M_1 G}|$), the position of pivot 1502 ($L_0, \alpha$), the position of guiding mirror 1522 ($L_d$), or the location of tuning reflector 1512 ($L_R, \beta$). Adjustment of any combination of these parameters can provide the necessary condition, $\Delta N_0(\lambda)+\Delta N(\lambda)<<1$.

For example, the position of tuning reflector 1512 may be selected such that, $|\overline{M_1 G}|+(n_{10}-1)d_1-(L_d \sin \psi_0+L_0 \cos \alpha+L_R \sin \beta)=0$. At the same time, the position of pivot 1502 can be defined such that the mode shift $\Delta N_0(\lambda)$ compensates the dispersion shift up to high orders. For a practical device, the compensation of high order dispersion yields and guarantees the continues tuning of the laser from the grating-tuned external cavity, i.e. $\Delta N_0(\lambda)+\Delta N(\lambda)<<1$.

Figure 16:
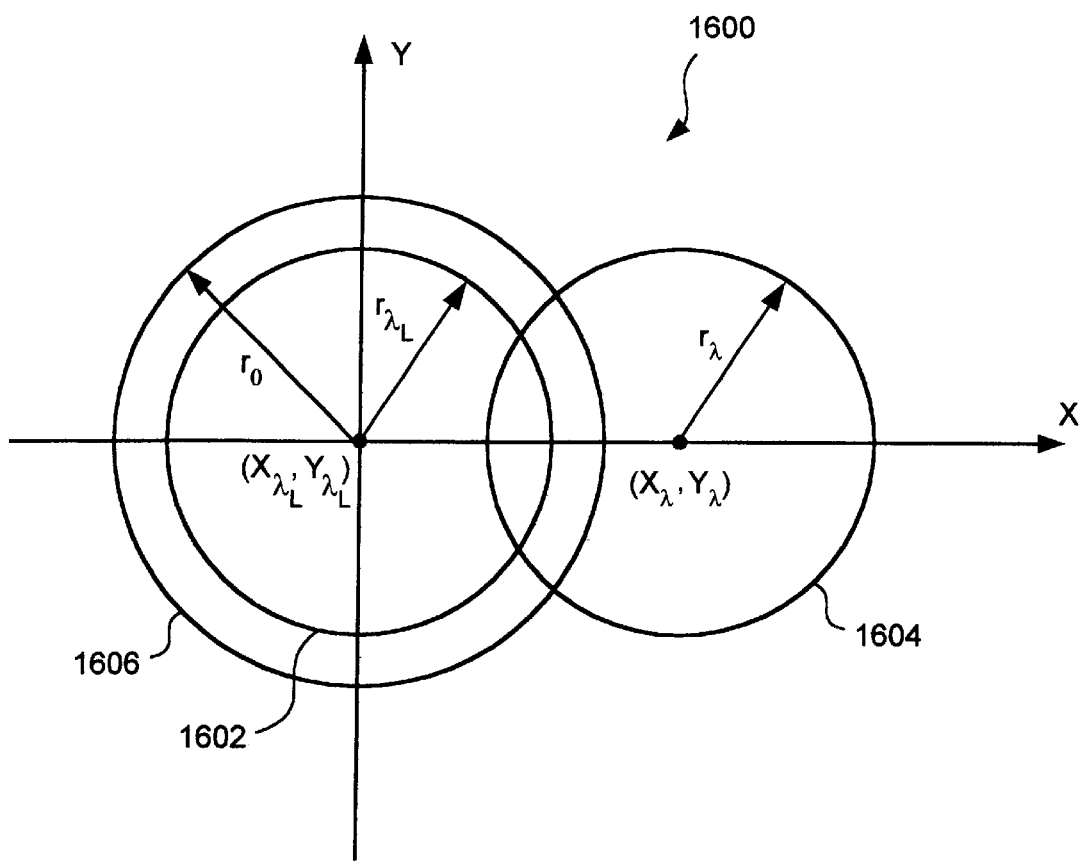
FIG. 16 shows a representation of the light radiation pattern in the X-Y focal plane of the beam collector shown in FIG. 14.

The following discussion provides a mathematical description for the structure and operation of the embodiment shown in FIG. 14. The intensity of collector incident light 1424 in the X'-Y' focal plane of beam collector 1426 is described by a two-dimensional (x', y') equation which includes an angular-cone distribution-function representing the beam focusing effect of beam collector 1426, $$I(\lambda,x',y')=I(\lambda)\zeta(x'-x'_\lambda,y'-y'_\lambda,f,\Omega),$$

where a normalized arbitrary distribution function $\zeta(x'-x'_\lambda, y'-y'_\lambda,f,\Omega)$ provides a light intensity distribution for focused light spot 1428 with beam center $(x_\lambda, y_\lambda, f)$ in the X'-Y' focal plane of beam collector 1426 as illustrated in FIG. 16.

If the grating of diffraction grid 1410 exhibits a one-dimensional variation, coordinates $x'_\lambda$ and $y'_\lambda$ can be expressed as $x'_\lambda=f \tan(\theta(\lambda)-\theta(\lambda_L))$ and $y'_\lambda=0$ where f represents the focal length of the beam collector 1426. In a preferred embodiment, beam collector 1426 comprises a convex lens and f represents the focal length of the convex lens. In the X-Y focal plane of beam collector 1426, optical coupling device 1430 is aligned with the center of focused light spot 1428 to receive the light with laser wavelength $\lambda_L$. In a preferred embodiment, optical coupling device 1430 comprises a single-mode fiber, a multi-mode transparent fiber or a waveguide designed for coupling a light beam. Through proper alignment with focused light spot 1428, optical coupling device 1430 receives only light with wavelength $\lambda_L$ by filtering out light with other wavelengths than $\lambda_L$.

The light energy $E(\lambda)$ coupled into waveguiding device 1432 by optical coupling device 1430 is determined by convolution of the X-Y focal light intensity distribution function $I(\lambda,x',y')$ with both an optical aperture function $\rho(x'-x'_{\lambda_L},y'-y'_{\lambda_L},z'-f,\Omega)$ characteristic to optical coupling device 1430 and with a numerical aperture function $\kappa(\lambda)$ representing the average insertion or surface-reflection light coupling loss over the entire area of optical coupling device 1430, $$E^{(fiber)}(\lambda)=I(\lambda)(1-\kappa(\lambda))\int\int\rho(x'-x'_{\lambda_L},y'-y'_{\lambda_L},f,\Omega)\cdot\zeta(x'-x'_\lambda,y'-y'_\lambda,f,\Omega)dx'dy'd\Omega=E(\lambda)(1-\kappa(\lambda))\sigma(\lambda)$$

where the filtering effect of the beam coupling device is represented by a filtering function $$\sigma(\lambda)=\int\int\int\rho(x'-x'_{\lambda_L},y'-y'_{\lambda_L},f,\Omega)\cdot\zeta(x'-x'_\lambda,y'-y'_\lambda,f,\Omega)dx'dy'd\Omega.$$

If the numerical aperture of optical coupling device 1430 is larger than the divergence of focused light spot 1428 and if the area of optical coupling device 1430 is larger than the size of focused light spot 1428 at the laser wavelength $\lambda=\lambda_L$, all the light of the respective beam spot is coupled into waveguiding device 1432. The energy of the light coupled into the fiber can therefore be expressed as, $$E^{(fiber)}(\lambda)\approx E(\lambda_L)(1-\kappa(\lambda_L)).$$

FIG. 16 illustrates how the present invention achieves spatial narrow band-pass filtering for light coupled into waveguiding device 1432 of FIG. 14. FIG. 16 shows the focal plane 1600 of beam collector 1426. Focal plane 1600 includes an aligned light spot 1602, a misaligned light spot 1604 and an optical aperture 1606. Consistent with the previous discussion, beam collector 1426 refracts collector incident light 1424 and concentrates it into a number of discrete light spots in the focal plane 1600 of beam collector 1426. The spatial position of each light spot depends upon the wavelength of the light associated with that particular light spot.

Aligned light spot 1602 represents focused light spot 1428 from FIG. 14 which comprises light of substantially wavelength $\lambda_L$. Aligned light spot 1602 is centered at coordinates $(x_{\lambda_L}, y_{\lambda_L})$ and has a radius of $r_{\lambda_L}$. The radius $r_{\lambda_L}$ is selected such that the resulting circular area includes only light with an intensity of at least 1/e of the peak value existing within aligned light spot 1602. Aligned light spot 1602 is concentrically collocated with optical aperture 1606. If the radius $r_0$ of optical aperture 1606 is larger than the radius $r^{\lambda_L}$ of aligned light spot 1602, aligned light spot 1602 is fully contained within optical aperture 1606 and light from aligned light spot 1602 may be fully coupled into waveguiding device 1432. In contrast, misaligned light beam 1604 is centered at coordinates $(x_\lambda, y_\lambda)$ and is not fully contained within optical aperture 1606. Consequently, light associated with misaligned light spot 1604 cannot be fully coupled into waveguiding device 1432 and is therefore at least partially filtered out.

As a result of spatial narrow band-pass filtering, therefore, for both light and SSE and ASE background noise radiation with wavelengths other than $\lambda_L$ ($\lambda \neq \lambda_L$), the energy coupled into waveguiding device 1432 upon proper alignment of optical aperture 1606 with aligned light spot 1602 is minimized such that $E^{(fiber)}(\lambda) \approx 0$.

Referring to FIG. 16, for $r_\lambda \leq r_0$, the filtering function associated with optical aperture 1406 can be expressed as $$\sigma(\lambda) = \pi^{-1} r_\lambda^{-2} \cdot \int\int\int \rho(x'-x'_{\lambda_L}, y'-y'_{\lambda_L}, f, \Omega) \cdot \zeta(x'-x'_\lambda, y'-y'_\lambda, f, \Omega) dx' dy' d\Omega.$$

For $r_\lambda \geq r_0$, however, the filtering function can be represented by $$\sigma(\lambda) = \pi^{-1} r_{\lambda_L}^{-2} \cdot \int\int\int \rho(x'-x'_{\lambda_L}, y'-y'_{\lambda_L}, f, \Omega) \cdot \zeta(x'-x'_\lambda, y'-y'_\lambda, f, \Omega) dx' dy' d\Omega.$$

The optical aperture function of optical aperture 1606 and the normalized distribution function describing the light intensity distribution for aligned light spot 1602 can then be approximated by, $$\rho(x'-x'_{\lambda_L}, y'-y'_{\lambda_L}, f, \Omega) = \mu(x'-x'_{\lambda_L}, y'-y'_{\lambda_L}, f) \Theta(\Omega) \Gamma(r_{\lambda_L} - r),$$

and respectively, $$\zeta(x'-x'_\lambda, y'-y'_\lambda, f, \Omega) = \tau(x'-x'_\lambda, y'-y'_\lambda, f) \Theta_{FIBER}(\Omega) \Gamma(r_\lambda - r'),$$

where $\Omega_L$ represents the cone angle of the light intensity distribution of aligned light spot 1602, $\Omega_{FIBER}$ represents the numerical aperture of optical aperture 1606, and the following formulas apply:

$$r = \sqrt{(x'-x'_{\lambda_L})^2 + (y'-y'_{\lambda_L})^2};$$

$$r' = \sqrt{(x'-x'_\lambda)^2 + (y'-y'_\lambda)^2};$$

$$\Gamma(r_{\lambda_L} - r) = \begin{cases} 1 & r_{\lambda_L} - r \geq 0 \\ 0 & r_{\lambda_L} - r < 0 \end{cases};$$

$$\Gamma(r_\lambda - r) = \begin{cases} 1 & r_\lambda - r \geq 0 \\ 0 & r_\lambda - r < 0 \end{cases};$$

$$\Theta(\Omega) \approx \begin{cases} 1 & \Omega \leq \Omega_L \\ 0 & \Omega > \Omega_L \end{cases}$$

(This formula represents the angular distribution function of aligned light spot 1602);

$$\Theta_{FIBER}(\Omega) \approx \begin{cases} 1 & \Omega \leq \Omega_{FIBER} \\ 0 & \Omega > \Omega_{FIBER} \end{cases}$$

(This formula represents the numerical function of optical aperture 1606);

$$x'_\lambda = f \tan[\theta(\lambda) - \theta(\lambda_L)];$$

$$y'_\lambda = 0;$$

$$x'_{\lambda_L} = 0;$$

$$y'_{\lambda_L} = 0.$$

Figure 17:
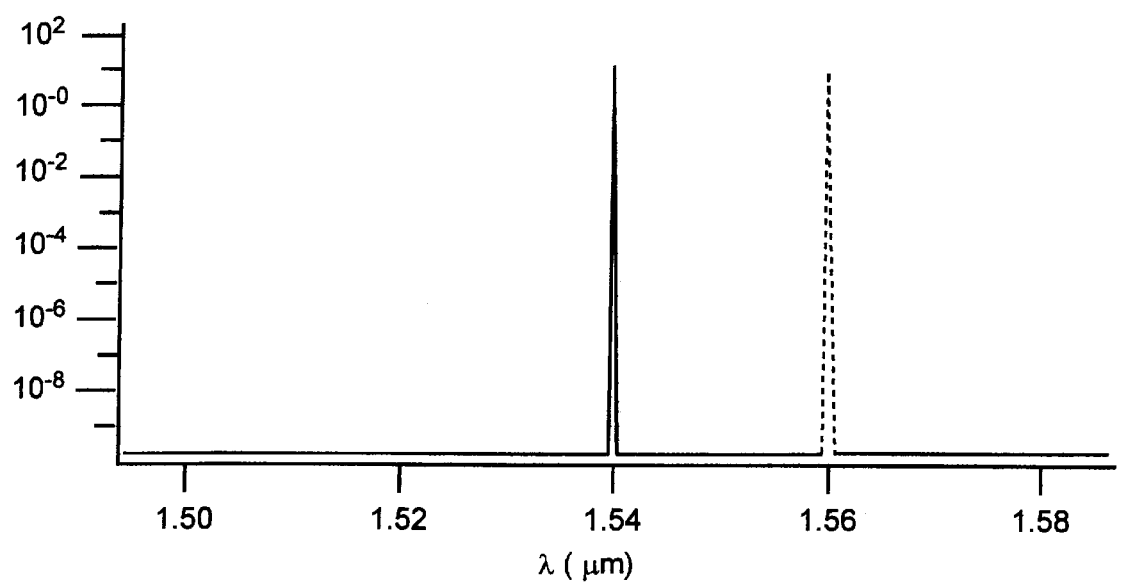
FIG. 17 shows a simulation of the effectiveness of SSE and ASE filtering achieved by an embodiment of the present invention.

FIG. 17 shows a simulation of the effectiveness of SSE and ASE suppression achieved by an embodiment of the present invention for $r_{\lambda_L} = r_0$, $f = 1000 \cdot r_0$, $d = 1$ μm, $\Omega_L \leq \Omega_{FIBER}$ and assuming a Gaussian light intensity distribution for aligned light spot 1602. Over the emission band of gain medium 1408 of FIG. 14, the present invention filters out SSE and ASE background noise radiation at all wavelengths other than the desired laser wavelength $\lambda_L$, which is shown in FIG. 17 to be approximately 1.54 μm. Consequently, the only light coupled into waveguiding device 1432 is light with the desired wavelength, $\lambda_L$.

An advantage of the present invention, as illustrated in the numerous embodiments discussed herein, is that it can maintain a maximum and constant level of light coupled into waveguiding device 1432 while the wavelength of output laser beam 1416 and of low noise laser beam 1434 is tuned across a wide range of wavelengths, i.e., it provides automatic wavelength and power tracking for the low-noise output laser beam. In the embodiment shown in FIG. 14, this advantage is achieved by appropriate selection of the physical dimensions of dual-beam laser system 1400.

Figure 18:
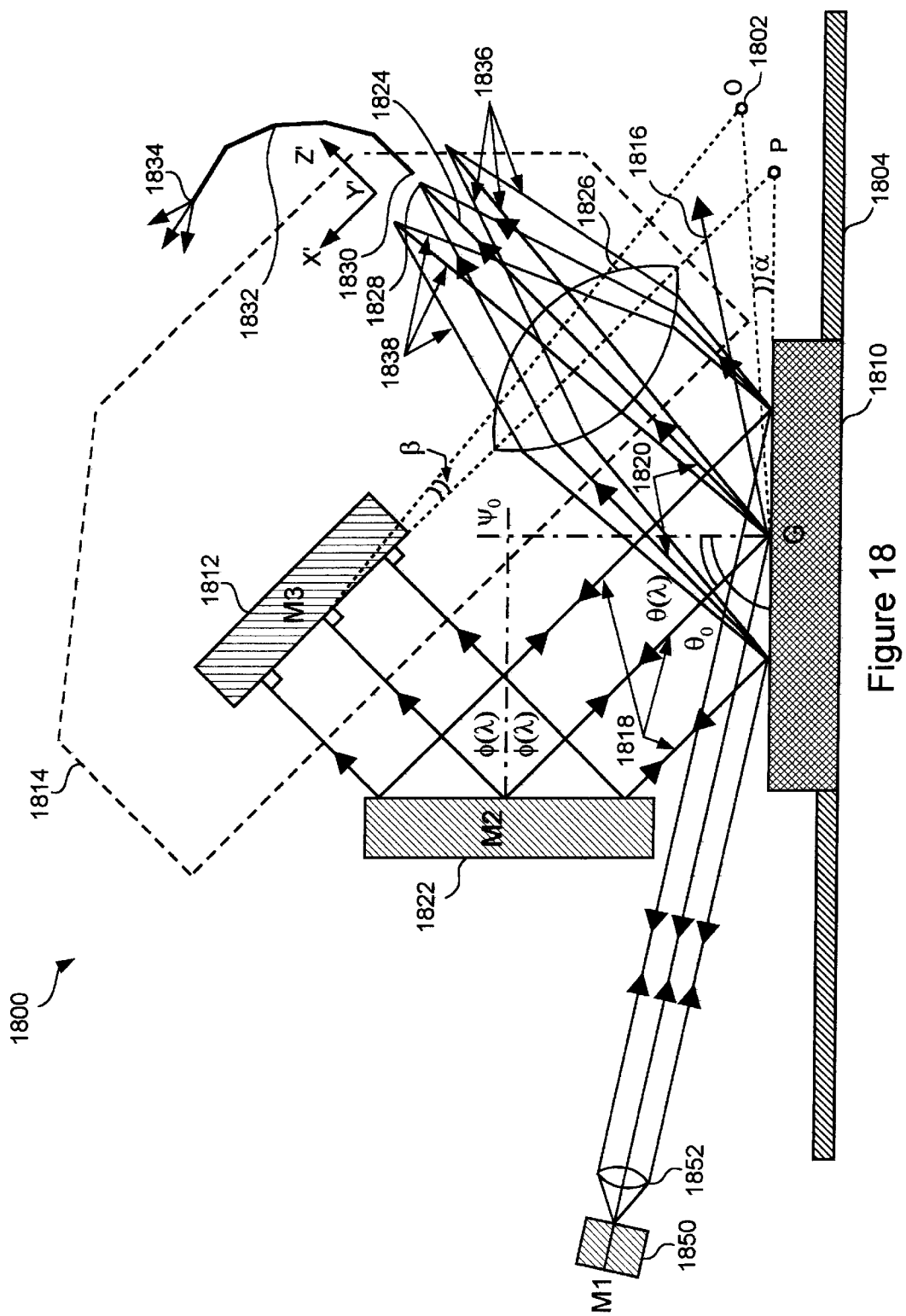
FIG. 18 shows another embodiment of the present invention with a laser diode acting as a light source and a collimation lens acting as a light collimating device.

FIG. 18 shows an alternative embodiment of the present invention. Dual-beam laser system 1800 comprises pivot 1802, base 1804, dispersion unit 1810, tuning reflector 1812, rotatable unit 1814, output laser beam 1816, first-order diffracted radiation 1818, reflected diffraction beam 1820, guiding mirror 1822, collector incident light 1824, beam collector 1826, focused light spot 1828, optical coupling device 1830, waveguiding device 1832, low noise laser beam 1834, angularly-separated SSE 1836, angularly-separated ASE 1838, laser diode 1850 and collimation lens 1852.

The structure of the embodiment shown in FIG. 18 is substantially identical with the structure of the embodiment shown in FIG. 14 except that the embodiment of FIG. 18 employs a laser diode 1850 to replace the combination of the plane reflector 1406 and the gain medium 1408 from FIG. 14 and introduces a collimation lens 1852 disposed along an optical path between laser diode 1850 and dispersion unit

1810. Since the output of laser diode 1850 generally exhibits an undesirable elliptically-divergent shape, collimation lens 1852 is employed to collimate the light incident on dispersion unit 1810 at a grazing angle. In a preferred embodiment, both facets of collimation lens 1852 are treated with an anti-reflection coating to reduce light feedback from internal reflection within collimation lens 1852. Further, a facet of laser diode 1850 oriented towards dispersion unit 1810 is also treated with an anti-reflection coating to maximize power output of laser diode 1850.

In operation, the embodiment of FIG. 18 functions substantially the same as the embodiment of FIG. 14 because the light beam generated by laser diode 1850 in conjunction with collimation lens 1852 is substantially identical with the light beam produced by gain element 1408 and plane reflector 1406. Consequently, the light incident at a grazing angle on diffraction grid 1810 is substantially identical with the light incident at a grazing angle on diffraction grid 1810, and therefore the description provided for the embodiment of FIG. 18 generally applies to the embodiment of FIG. 18.

Figure 19:
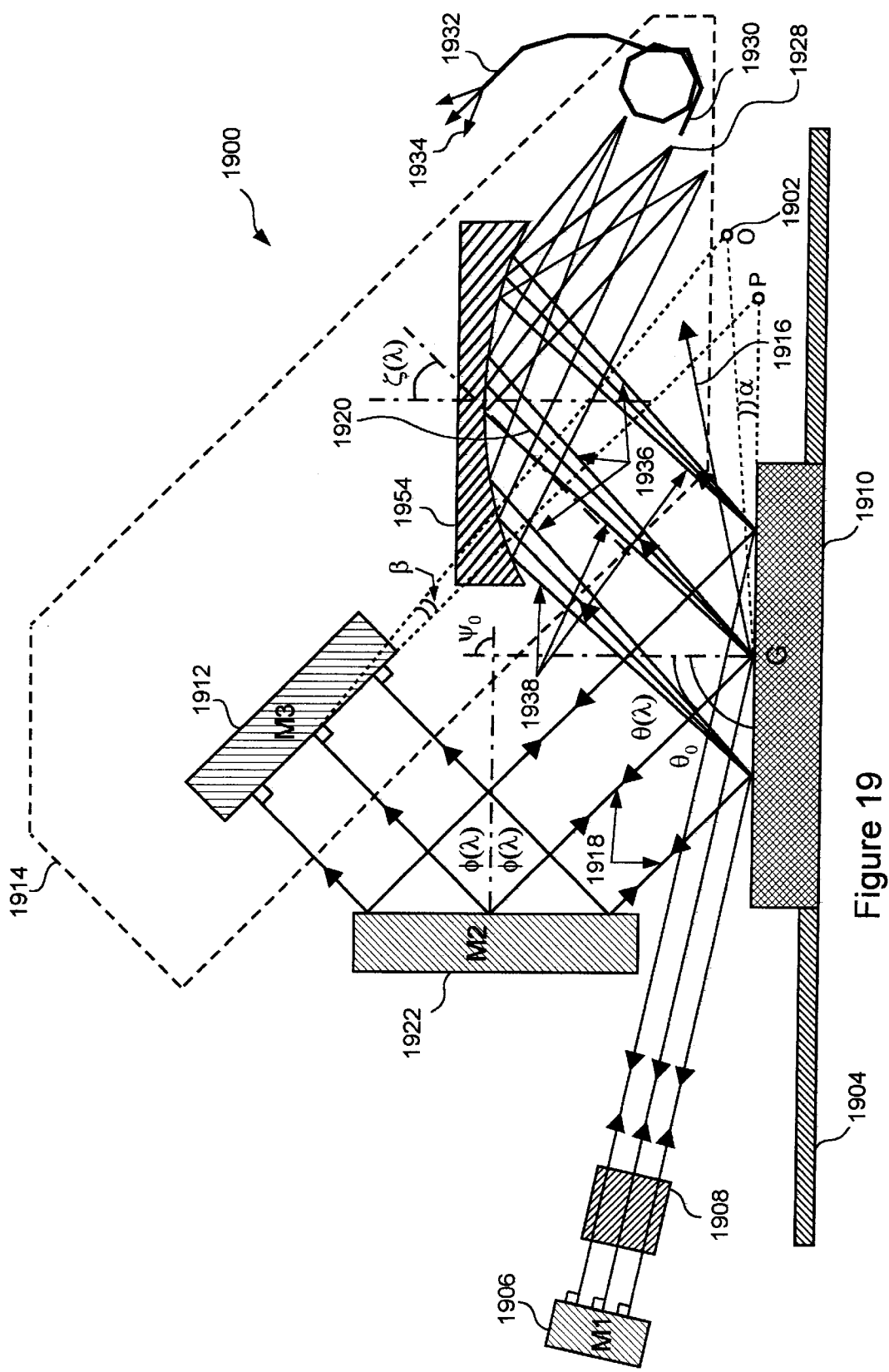
FIG. 19 shows another embodiment of the present invention with a concave mirror acting as a beam collector.

FIG. 19 shows another alternative embodiment of the present invention. Dual-beam laser system 1900 comprises pivot 1902, base 1904, plane reflector 1906, gain medium 1908, dispersion unit 1910, tuning reflector 1912, rotatable unit 1914, output laser beam 1916, first-order diffracted radiation 1918, reflected diffraction beam 1920, guiding mirror 1922, focused light spot 1928, optical coupling device 1930, waveguiding device 1932, low noise laser beam 1934, angularly-separated SSE 1936, angularly-separated ASE 1938, and concave mirror 1954.

The structure of the embodiment of FIG. 19 is substantially identical with the structure of the embodiment of FIG. 14, except that the embodiment of FIG. 19 substitutes a concave mirror 1954 for beam collector 1426. Concave mirror 1954 is mechanically coupled to rotatable unit 1914 such that a concave reflective surface of concave mirror 1954 is oriented in the general direction of guiding mirror 1922 to intercept reflected diffraction beam 1920. Optical coupling device 1930 and waveguiding device 1932 are mechanically coupled to rotatable unit 1914 on the same side of concave mirror 1954 as guiding mirror 1922.

In operation, the embodiment shown in FIG. 19 functions substantially the same as the embodiment of FIG. 14. Reflected diffraction beam 1920 is substantially identical with collector incident light 1424 from FIG. 14. Unlike in the embodiment of FIG. 14, however, reflected diffraction beam 1920 is not refracted by beam collector 1426, which comprises a lens, but is instead reflected by concave mirror 1954.

Concave mirror 1954 is designed to reflect and focus reflected diffraction beam 1920 in a pattern substantially identical with the pattern experienced by the light refracted by beam collector 1426 in the embodiment of FIG. 14. Consequently, concave mirror 1954 reflects and concentrates reflected diffraction beam 1920 into focused light spot 1928 which is substantially identical to focused light spot 1428 of FIG. 14. To take advantage of the spatial filtering technique previously discussed in connection with the embodiment of FIG. 14, optical coupling device 1930 is mechanically coupled to rotatable unit 1914 such that focused light spot 1928 is coupled into optical coupling device 1930.

Upon reflection by concave mirror 1954, reflected diffraction beam 1924 propagates at an angle $\xi(\lambda_L)$ with respect to the focal axis of concave mirror 1954. Angle $\xi(\lambda_L)$ does not exhibit any dependence on wavelength or on the position of rotatable unit 1914, but is instead fully determined by initial selection and alignment of the components of dual-beam laser system 1900. To ensure full coupling of focused light spot 1928 into optical coupling device 1930, the area of optical coupling device 1930 must be larger than the effective size of focused light spot 1928 and the numerical aperture of optical coupling device 1930 must be larger than the convergence of focused light spot 1928. If these conditions are satisfied, proper initial design of dual-beam laser system 1900 results in continuous and stable coupling of selected focused light spot 1928 into waveguiding device 1932 with simultaneous and effective filtering of SSE and ASE background light regardless of wavelength variations in the system as a result of laser tuning.

Figure 20:
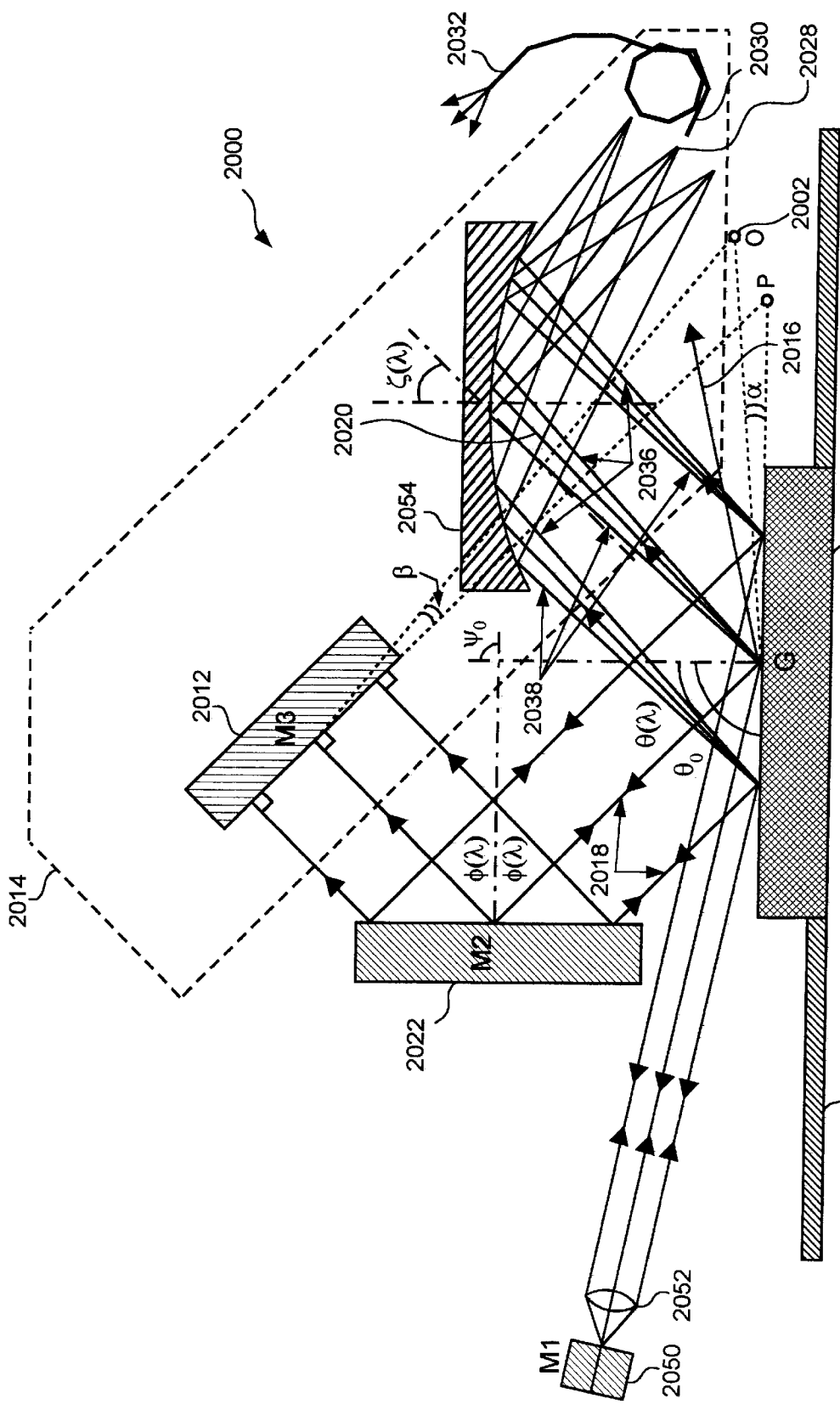
FIG. 20 shows another embodiment of the present invention with a laser diode acting as a light source, a collimation lens acting as a light collimating device and a concave mirror acting as beam collector.

FIG. 20 shows yet another embodiment of the present invention. Dual-beam laser system 2000 comprises pivot 2002, base 2004, dispersion unit 2010, tuning reflector 2012, rotatable unit 2014, output laser beam 2016, first-order diffracted diffraction radiation 2018, reflected diffraction beam 2020, guiding mirror 2022, focused light spot 2028, optical coupling device 2030, waveguiding device 2032, low noise laser beam 2034, angularly-separated SSE 2036, angularly-separated ASE 2038, laser diode 2050, collimation lens 2052 and concave mirror 2054.

The structure of the embodiment shown in FIG. 20 is substantially identical with the embodiment shown in FIG. 14, except that the embodiment of FIG. 20 includes the modifications introduced by the embodiments shown in FIG. 18 and FIG. 19. More specifically, the embodiment of FIG. 20 employs a laser diode 2050 to replace the combination of the plane reflector 1406 and the gain medium 1408 from FIG. 14 and introduces a collimation lens 2052 disposed along an optical path between laser diode 2050 and dispersion unit 2010, as discussed in connection with FIG. 18. Additionally, the embodiment of FIG. 20 substitutes a concave mirror 2054 for beam collector 1426, as described in conjunction with FIG. 19. In a preferred embodiment, both facets of collimation lens 2052 are treated with an anti-reflection coating to reduce light feedback from internal reflection within collimation lens 2052. Further, a facet of laser diode 2050 oriented towards dispersion unit 2010 is also treated with an anti-reflection coating to maximize power output of laser diode 2050.

In operation, both modifications operated to the embodiment shown in FIG. 20 perform substantially identical functions as the original elements they replace, as discussed in connection with the embodiments of FIG. 18 and FIG. 19. Consequently, the descriptions provided for the embodiments shown in FIGS. 14, 18 and 19 also apply to the embodiment of FIG. 20.

Figure 21:
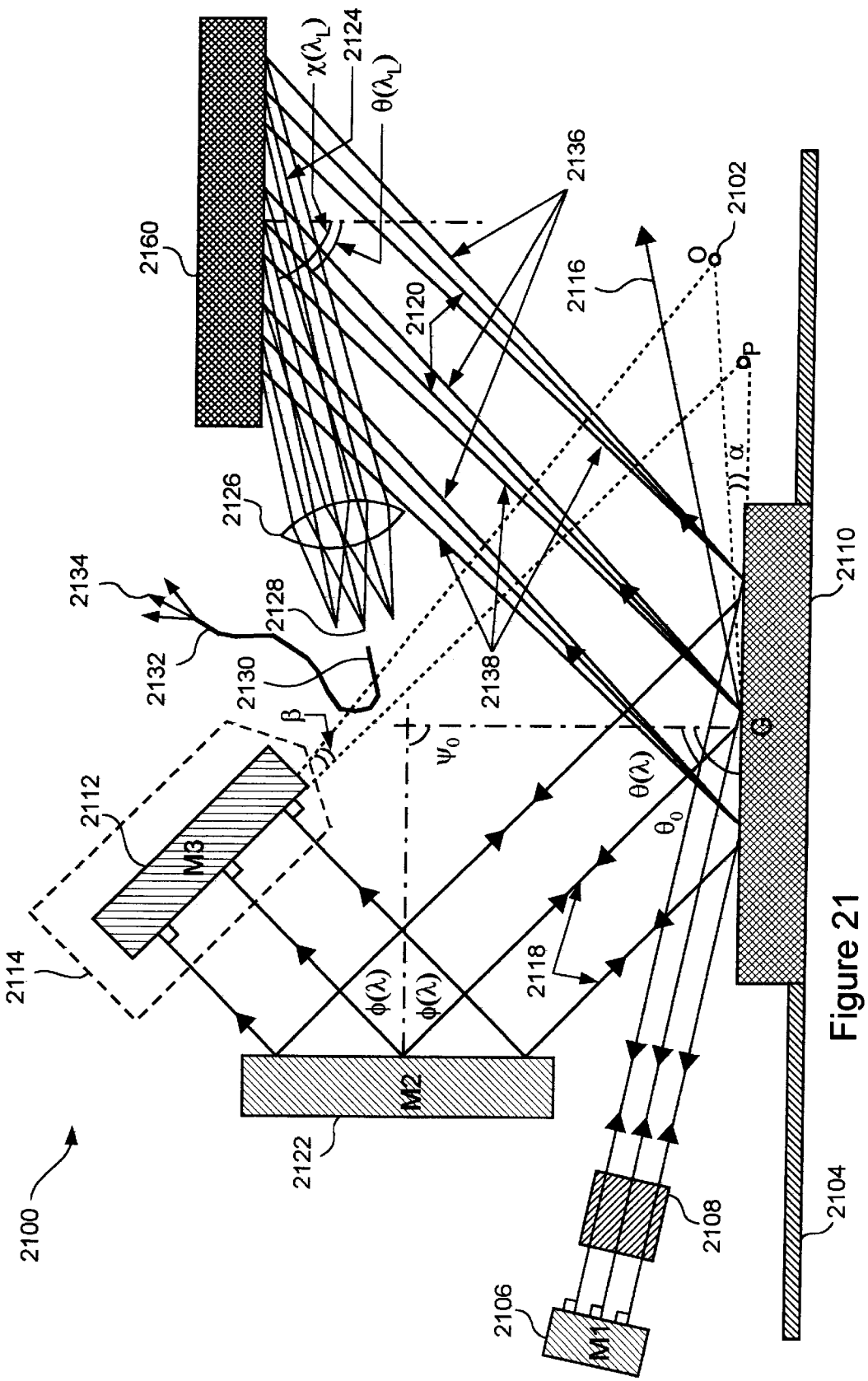
FIG. 21 shows another embodiment of the present invention with a dispersion unit acting as both a guiding element and beam collector.

FIG. 21 shows yet another alternative embodiment of the present invention. Dual-beam laser system 2100 comprises pivot 2102, base 2104, plane reflector 2106, gain medium 2108, dispersion unit 2110, tuning reflector 2112, rotatable unit 2114, output laser beam 2116, first-order diffracted radiation 2118, reflected diffraction beam 2120, beam collector incident light 2124, beam collector 2126, focused light spot 2128, optical coupling device 2130, waveguiding device 2132, low noise laser beam 2134, angularly-separated SSE 2136, angulary-separated ASE 2138, and guiding dispersion unit 2160.

The structure of the embodiment of FIG. 21 is substantially identical with the structure of the embodiment of FIG. 14, except that in the embodiment of FIG. 21 a guiding dispersion unit 2160 substitutes guiding mirror 1422 of FIG. 14 and beam collector 2126, optical coupling device 2130 and waveguiding device 2132 are removed from rotatable unit 2114. Guiding dispersion unit 2160 is mounted to the base 2104, and substantially parallel with, dispersion unit 2110, and is oriented towards dispersion unit 2110 to intercept reflected diffraction beam 2120. Beam collector 2126, optical coupling device 2130 and waveguiding device 2132 are mounted above dispersion unit 2110 and are fixed with respect to guiding dispersion unit 2160.

In operation, the embodiment shown in FIG. 21 functions substantially the same as the embodiment of FIG. 14. Reflected diffraction beam 2120 is substantially identical with reflected diffraction beam 1420 from FIG. 14. Unlike in the embodiment of FIG. 14, however, reflected diffraction beam 2120 is not reflected by guiding mirror 1422, but is instead diffracted by guiding dispersion unit 2160.

Guiding dispersion unit 2160 is designed to diffract reflected diffraction beam 2120 in a pattern substantially identical with the pattern experienced by the light reflected by guiding mirror 1422 in the embodiment of FIG. 14. Consequently, beam collector incident light 2124 is substantially identical with beam collector incident light 1424 from FIG. 14. As a result, beam collector 2126 refracts and focuses beam collector incident light 2124 into focused light spot 2128 which is substantially identical to focused light spot 1428 of FIG. 14.

Reflected diffraction beam 2124 comprised in collector incident radiation 2124 forms an angle $\chi(\lambda_L)$ with the normal of guiding dispersion unit 2160, where $\chi(\lambda_L)=\theta_0$.

As indicated by this formula, angle $\chi(\lambda_L)$ does not exhibit any dependence on wavelength or on the position of rotatable unit 2114, but is instead fully determined by initial selection and alignment of the components of dual-beam laser system 2100. To ensure full coupling of focused light spot 2128 into optical coupling device 2130, the area of optical coupling device 2130 must be larger than the effective size of focused light spot 2128 and the numerical aperture of optical coupling device 2130 must be larger than the convergence of focused light spot 2128. If these conditions are satisfied, proper initial design of dual-beam laser system 2100 results in continuous and stable coupling of selected focused light spot 2128 into waveguiding device 2132 with simultaneous and effective filtering of SSE and ASE background light regardless of wavelength variations in the system as a result of laser tuning.

Figure 22:
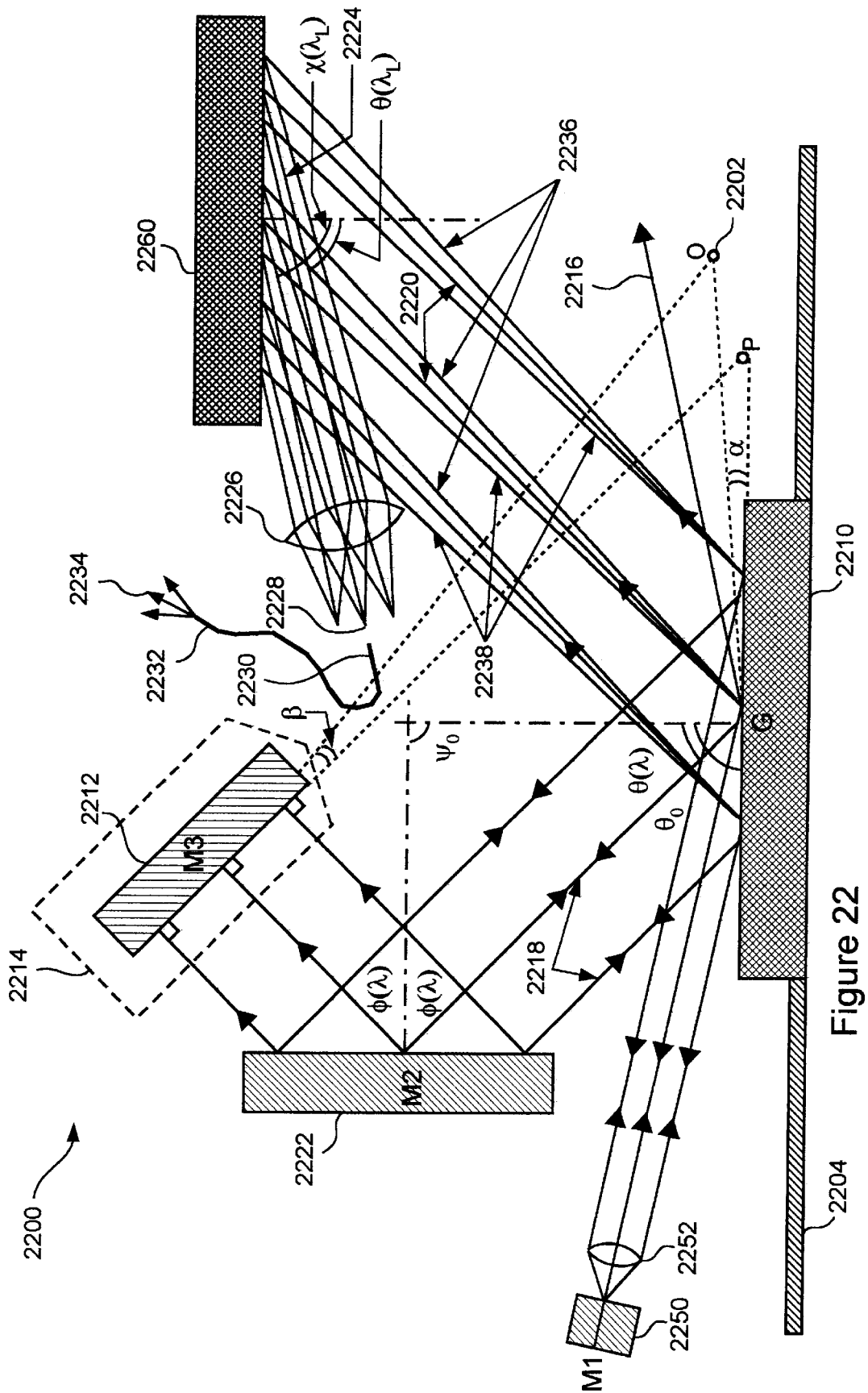
FIG. 22 shows another embodiment of the present invention with a laser diode acting as a light source, a collimation lens acting as a light collimating device and a dispersion unit acting as both a guiding element and beam collector.

FIG. 22 shows an alternative embodiment of the present invention. Dual-beam laser system 2200 comprises pivot 2202, base 2204, plane reflector 2206, gain medium 2208, dispersion unit 2210, tuning reflector 2212, rotatable unit 2214, output laser beam 2216, first-order diffracted radiation 2218, reflected diffraction beam 2220, beam collector incident light 2224, beam collector 2226, focused light spot 2228, optical coupling device 2230, waveguiding device 2232, low noise laser beam 2234, angularly-separated SSE 2236, angulary-separated ASE 2238, laser diode 2250, collimation lens 2252 and guiding dispersion unit 2260.

The structure of the embodiment shown in FIG. 22 is substantially identical with the structure of the embodiment shown in FIG. 21 except that the embodiment of FIG. 22 employs a laser diode 2250 to replace the combination of plane reflector 2106 and gain medium 2108 from FIG. 21 and introduces a collimation lens 2252 disposed along an optical path between laser diode 2250 and dispersion unit 2210. Since the output of laser diode 2250 generally exhibits an undesirable elliptically-divergent shape, collimation lens 2252 is employed to collimate the light incident on dispersion unit 2210 at a grazing angle. In a preferred embodiment, both facets of collimation lens 2252 are treated with an anti-reflection coating to reduce light feedback from internal reflection within collimation lens 2252. Further, a facet of laser diode 2250 oriented towards dispersion unit 2210 is also treated with an anti-reflection coating to maximize power output of laser diode 2250.

In operation, the embodiment of FIG. 22 functions substantially the same as the embodiment of FIG. 21 because the light beam generated by laser diode 2250 in conjunction with collimation lens 2252 is substantially identical with the light beam produced by gain element 2108 and plane reflector 2106. Consequently, the light incident at a grazing angle on diffraction grid 2210 is substantially identical with the light incident at a grazing angle on diffraction grid 2110, and therefore the description provided for the embodiment of FIG. 21 also applies to the embodiment of FIG. 22.

Figure 23:
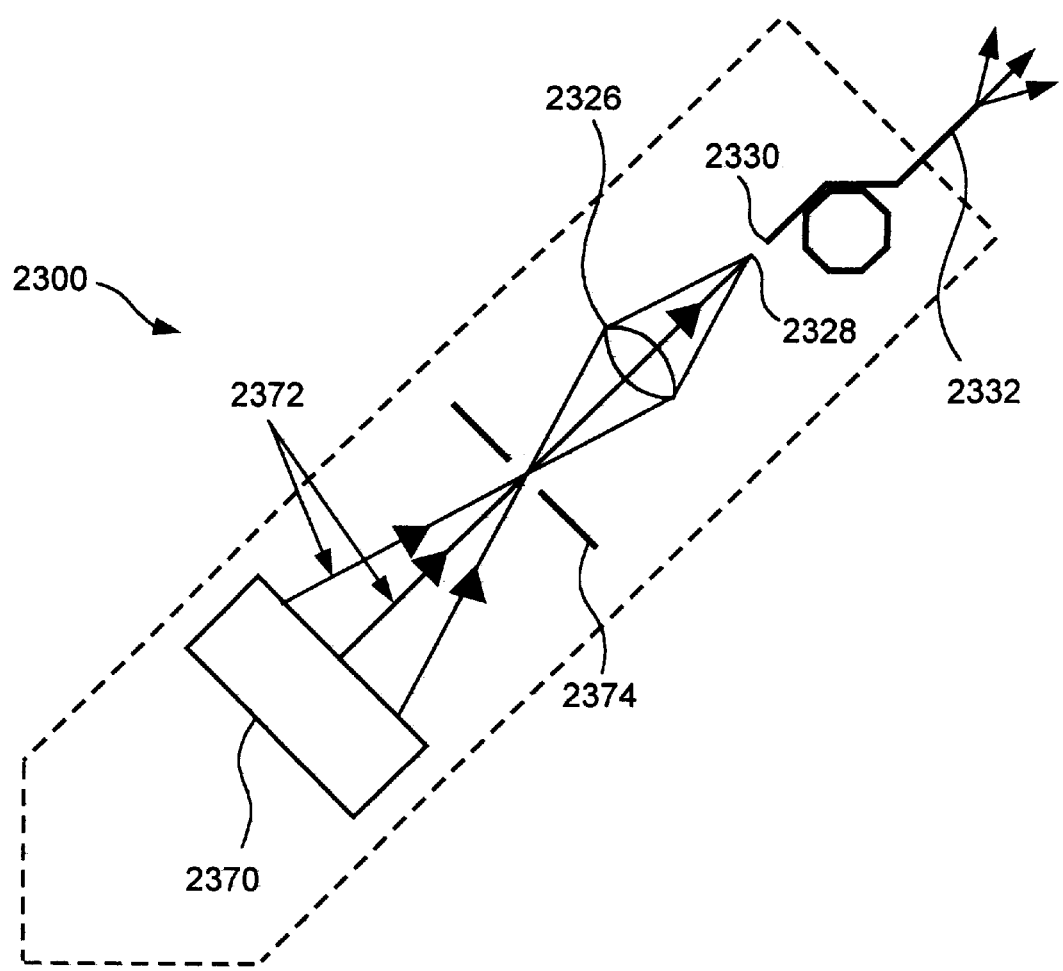
FIG. 23 shows another embodiment of the present invention with an optical transmission pinhole acting as a narrow, band-pass filter.

FIG. 23 shows yet another embodiment of the present invention. The preceding description of various embodiments of this invention taught how an optical aperture coupled to a waveguiding device can be employed as a spatial narrow band-pass filter to suppress SSE and ASE background light with wavelengths other than a desired wavelength. The embodiment of FIG. 23 illustrates how an optical transmission pinhole can be employed as a narrow band-pass filter to either replace or supplement and enhance the filtering effect of an optical coupling device.

FIG. 23 shows a simplified representation of the complete laser system described in prior embodiments. Laser system 2300 includes light generator 2370, pinhole incident light 2372, pinhole 2374, beam collector 2326, focused light spot 2328, optical coupling device 2330 and waveguiding device 2332.

Light generator 2370 and optical coupling device 2330 are mounted at opposite ends of laser system 2300. Referring to the embodiment of FIG. 14 for example, light generator 2370 could include a subsystem comprising plane reflector 1406, gain medium 1408, dispersion unit 1410, tuning reflector 1412 and guiding mirror 1422. Pinhole 2374 and beam collector 2326 are disposed along an optical path between light generator 2370 and optical coupling device 2330 such that optical aperture 2330 is located distally from light generator 2370 with respect to pinhole 2374. In an alternative embodiment, beam collector 2326 could be replaced by a concave mirror, as disclosed in the embodiment shown in FIG. 19 for example. Optical aperture 2330 is operationally connected to waveguiding device 2332 to permit coupling of light.

In operation, light generator 2370 projects pinhole incident light 2372 towards pinhole 2374. Pinhole 2374 includes a transparent area which permits part of pinhole incident light 2372 to propagate beyond pinhole 2374 and illuminate beam collector 2326. Beam collector 2326 focuses the incident light radiation into focused light spot 2328 which is pre-aligned with optical coupling device 2330 to permit efficient light coupling into waveguiding device 2332. Pinhole 2374 acts as a physical spatial narrow band-pass filter effectively suppressing SSE and ASE background light, and therefore provides a first-order filtering stage for light propagating towards beam collector 2326. Consequently, the light incident on beam collector 2326 is already filtered prior to being concentrated into focused light spot 2328. This advantage could be employed, among others, to relax the design constraints imposed on the optical characteristics of beam collector 2326 and the alignment requirements associated with narrow band-pass filtering as taught by the present invention. Further, the SSE and ASE radiation may be cut off by the spatial filter so that a broader optical coupling device 2330 is still adequate to couple the laser beam into waveguiding device 2332. A larger receiving aperture decreases the probability that optical coupling device 2330 is damaged by the heat produced by the high optical energy being coupled into waiveguiding device 2332.

It will be manifest that various additions, modifications and rearrangements of the features of the invention may be made without deviating from the spirit and scope of the underlying inventive concept. It is intended that the scope of the invention as defined by the appended claims and their equivalents cover all such additions, modifications, and rearrangements. The appended claims are not to be interpreted as including means-plus-function limitations, unless such a limitation is explicitly recited in a given claim using the phrase "means-for." Expedient embodiments of the invention are differentiated by the appended claims.

What is claimed is:

1. An external cavity laser comprising:
   a) a dispersion unit;
   b) a gain element for producing coherent light incident upon said dispersion unit to generate a diffraction beam,
   c) a tuning reflector for reflecting said diffraction beam back to said dispersion unit such that a first portion of said diffraction beam is further diffracted by said dispersion unit to enter said gain element to thereby selecting a desired wavelength $\lambda_L$ of said coherent light, and a second portion of said diffraction beam is reflected by said dispersion unit to produce a reflected diffraction beam containing said desired wavelength $\lambda_L$ and at least one angularly-separated wavelength $\lambda$;
   d) a physical filtering device for spatially filtering from said reflected diffraction beam said at least one angularly-separated wavelength $\lambda$, thereby producing a low-noise laser beam at said desired wavelength $\lambda_L$.

2. The external cavity laser of claim 1, wherein said at least one angularly-separated wavelength $\lambda$ comprises source spontaneous emission generated by said gain element.

3. The external cavity laser of claim 1, wherein said at least one angularly-separated wavelength $\lambda$ comprises amplified spontaneous emission generated by said gain element.

4. The external cavity laser of claim 1, wherein said tuning reflector is rotatably mounted with respect to said dispersion unit such that rotation of said tuning reflector tunes said low-noise laser beam continuously and mode-hop-free.

5. The external cavity laser of claim 4, wherein said tuning reflector comprises at least one element selected from the group consisting of optical prisms and mirrors.

6. The external cavity laser of claim 1, wherein said physical filtering device comprises at least one element selected from the group consisting of a mirror, a grating, a beam collector and a pin-hole.

7. The external cavity laser of claim 6, wherein said beam collector comprises a guiding element having a focusing power.

8. The external cavity laser of claim 7, wherein said guiding element is a lens or a mirror.

9. The external cavity laser of claim 7, wherein said guiding element is used in combination with said pin-hole.

10. The external cavity laser of claim 1, wherein said physical filtering device further comprises an optical coupling device located along a beam path of said reflected diffraction beam for coupling said low-noise laser beam into a waveguiding device.

11. The external cavity laser of claim 10, wherein said optical coupling device comprises an aperture.

12. The external cavity laser of claim 11, wherein said waveguiding device comprises an optical fiber.

13. The external cavity laser of claim 12, wherein said aperture comprises an aperture of said optical fiber.

14. The external cavity laser of claim 13, wherein said aperture comprises a tip of said optical fiber.

15. The external cavity laser of claim 11, wherein said aperture is dimensioned to intercept an aligned light spot comprising said low-noise laser beam.

16. The external cavity laser of claim 15, wherein said aperture is further dimensioned to intercept light with an intensity of at least lie of a peak value existing within said aligned light spot.

17. The external cavity laser of claim 10, wherein said waveguiding device is selected from the group consisting of a single-mode optical fiber and a multi-mode optical fiber.

18. The external cavity laser of claim 1, wherein said dispersion unit comprises a diffraction grating.

19. The external cavity laser of claim 1, wherein said gain element comprises a laser diode and said external cavity laser further comprises a collimating lens disposed along an optical path of said coherent light incident upon said dispersion unit to collimate said coherent light.

20. A method for obtaining a low-noise laser beam from an external cavity laser, said method comprising:
    a) generating coherent light from a gain element;
    b) directing said coherent light at a dispersion unit to generate a diffraction beam;
    c) reflecting said diffraction beam back to said dispersion unit such that a first portion of said diffraction beam is further diffracted by said dispersion unit to enter said gain element thereby selecting a desired wavelength $\lambda_L$ of said coherent light, and a second portion of said diffraction beam is reflected by said dispersion unit to produce a reflected diffraction beam containing said desired wavelength $\lambda_L$ and at least one angularly-separated wavelength $\lambda$;
    d) spatially filtering from said reflected diffraction beam said at least one angularly-separated wavelength $\lambda$, thereby producing said low-noise laser beam at said desired laser wavelength $\lambda_L$.

21. The method of claim 20, wherein said at least one angularly-separated wavelength comprises a radiation selected from the group of source spontaneous emission and amplified spontaneous emission.

22. The method of claim 20, wherein said step of spatially filtering comprises increasing the spatial separation between said at least one angularly-separated wavelength $\lambda$ and said desired wavelength $\lambda_L$.

23. The method of claim 22, wherein said step of increasing the spatial separation is achieved by further reflecting said reflected diffraction beam.

24. The method of claim 20, wherein said step of spatially filtering comprises focusing said reflected diffraction beam.

25. The method of claim 20, wherein said step of spatially filtering comprises passing said reflected diffraction beam through a pin-hole.

26. The method of claim 20, wherein said step of spatially filtering comprises admitting said reflected diffraction beam comprising said low-noise laser beam at said desired wavelength $\lambda_L$ into a waveguiding device.

27. The method of claim 26, wherein said step of admitting comprises aperturing an aligned light spot comprising said low-noise laser beam at said desired wavelength $\lambda_L$.

* * * * *